US010837100B2

(12) United States Patent
Johnson et al.

(10) Patent No.: US 10,837,100 B2
(45) Date of Patent: Nov. 17, 2020

(54) METHOD OF PRODUCING A PVD LAYER AND A COATED CUTTING TOOL

(71) Applicant: SANDVIK INTELLECTUAL PROPERTY AB, Sandviken (SE)

(72) Inventors: Lars Johnson, Stockholm (SE); Marta Saraiva, Bandhagen (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 4 days.

(21) Appl. No.: 16/063,875

(22) PCT Filed: Dec. 20, 2016

(86) PCT No.: PCT/EP2016/081989
§ 371 (c)(1),
(2) Date: Jun. 19, 2018

(87) PCT Pub. No.: WO2017/108833
PCT Pub. Date: Jun. 29, 2017

(65) Prior Publication Data
US 2018/0371607 A1     Dec. 27, 2018

(30) Foreign Application Priority Data
Dec. 22, 2015   (EP) .................................... 15201990

(51) Int. Cl.
    *C23C 14/32*     (2006.01)
    *C23C 14/34*     (2006.01)
    (Continued)

(52) U.S. Cl.
    CPC ............ *C23C 14/325* (2013.01); *C23C 14/06* (2013.01); *C23C 14/0635* (2013.01);
    (Continued)

(58) Field of Classification Search
    USPC ........... 51/307, 309; 428/336, 697, 698, 699
    See application file for complete search history.

(56) References Cited

U.S. PATENT DOCUMENTS 4,895,765 A *  1/1990  Sue ..................... C23C 14/0021
                                                  428/698
2006/0292399 A1* 12/2006 Sjolen ................ C23C 14/0021
                                                  428/698

FOREIGN PATENT DOCUMENTS

JP       2003-117705   *  4/2003
JP       2009-299142   * 12/2009
(Continued)

OTHER PUBLICATIONS

Uglov et al "Thermal stability of nanocrystalline (Ti,Zr)0.54Al0.46N films implanted by He+ ions." Nuclear Instruments and Methods in Physics Research B 354 p. 269-273. (Year: 2015).*
(Continued)

*Primary Examiner* — Archene A Turner
(74) *Attorney, Agent, or Firm* — Corinne R. Gorski

(57) ABSTRACT

A method for producing a coating on a substrate, wherein the coating includes a PVD layer (A), deposited by cathodic arc evaporation, being a compound of the formula $Me_xSi_yAl_zC_aN_bO_c$, wherein Me is one or more metals of groups 4, 5 and 6 in the IUPAC periodic table of elements. The PVD layer (A) is deposited by applying a pulsed bias voltage of from about −40 to about −450 V to the substrate and using a duty cycle of less than about 12% and a pulsed bias frequency of less than about 10 kHz. A coated cutting tool having a substrate and a coating is also disclosed, wherein the coating includes the PVD layer (A) with the compound of the formula $Me_xSi_yAl_zC_aN_bO_c$. The PVD layer (A) is crystalline having a FWHM (Full Width at Half Maximum) value for the cubic (111) peak in X-ray diffraction of ≤0.3 degrees (2theta).

15 Claims, 20 Drawing Sheets

(51) Int. Cl.
*C23C 30/00* (2006.01)
*C23C 14/06* (2006.01)
*C23C 14/08* (2006.01)
*C23C 14/10* (2006.01)

(52) U.S. Cl.
CPC ...... *C23C 14/0641* (2013.01); *C23C 14/0664* (2013.01); *C23C 14/0676* (2013.01); *C23C 14/08* (2013.01); *C23C 14/10* (2013.01); *C23C 14/345* (2013.01); *C23C 30/005* (2013.01)

(56) References Cited

FOREIGN PATENT DOCUMENTS

| KR | 20010037811 | * | 5/2001 | |
|----|----|----|----|----|
| RU | 2461664 C2 | | 9/2012 | |
| RU | 2507302 C2 | | 2/2014 | |
| WO | 2013045454 A2 | | 4/2013 | |
| WO | WO 2013/045454 A2 | * | 4/2013 | ............. C23C 14/00 |
| WO | 2015032431 A1 | | 3/2015 | |

OTHER PUBLICATIONS

Polcar et al "High Temperature properties of CrAlN, CrAlSiN and AlCrSiN coatings—Structure and oxidation." Materials Chemistry & Physics 129 p. 195-201. (Year: 2011).*

Ramana et al "Structure, composition and microhardness of (Ti,Zr)N and (Ti,Al)N coatings prepared by DC magnetron sputtering" Material Letters 58 p. 2553-2558. (Year: 2008).*

El-Awadi G A et al: Phase Transition and Hardness of TiAlN Coatings Deposited o WC/Co by MSIP:, International 9th Conference of Nuclear Sciences and Applications, Feb. 11-14, 2008, Sharm Al Sheik [EG] vol. EG0800320, Feb. 11, 2008, Feb. 14, 2008, pp. 1-10.

Olbrich W et al: "Improved control of TiN coating properties using cathodic arc evaporation with a pulsed bias", Surface and Coatings Technology, vol. 49, No. 1-3, Dec. 10, 1991, pp. 258-262.

Stryhalski J et al: "Pulsed bias effet on crystallinity and nano-roughness of Ti6A14V-N films deposited by grid assisted magnetron sputtering system", Materials Research, vol. 17, No. 6, Dec. 2014, pp. 1545-1549.

* cited by examiner

METHOD OF PRODUCING A PVD LAYER AND A COATED CUTTING TOOL

RELATED APPLICATION DATA

This application is a § 371 National Stage Application of PCT International Application No. PCT/EP2016/081989 filed Dec. 20, 2016 claiming priority to EP 15201990.7 filed Dec. 22, 2015.

TECHNICAL FIELD

The present invention relates in one aspect to a method for producing a PVD layer and in a further aspect to a coated cutting tool.

BACKGROUND

Physical vapour deposition (PVD) is a well-known technique to obtain wear-resistant coatings on a substrate of, e.g., a hardmetal. These coatings find applications as cutting tools for metal machining, such as inserts and drills.

PVD processes commonly used include arc evaporation, magnetron sputtering and ion plating. Advantages of the arc evaporation process over other PVD processes generally include better adhesion to an underlying substrate or layer and higher deposition rates.

However, in layers made by the arc evaporation process one normally gets lattice-defect rich coatings that when looked in magnification from above look "smeared out" without any features of separate crystal grains visible. The defects, such as point defects, lead to an increased residual compressive stress in the coating.

In sputtered layers, on the other hand, one might get lower defect density, higher crystallinity, and sometimes crystals facets on the surface.

In the arc evaporation process, an arc current is applied to a metal target or targets creating a metal vapour or plasma within a vacuum chamber. A bias voltage is applied to a substrate while a target acts as a cathode surface. An arc is ignited and a small emitting area is created where vapourised cathode material is leaving the cathode with high velocity towards the substrate. In an usual set up a target or targets of the desired metal or combination of metals to be present in the coating is used and the deposition process is performed in the presence of a reactive gas depending on which compound is to be coated. Usually as reactive gas nitrogen is used when a metal nitride is desired, methane or ethane for a metal carbide, methane or ethane together with nitrogen for a metal carbonitride, and further addition of oxygen for depositing a metal carboxynitride.

The bias voltage applied to the substrate to be coated can be applied in DC mode or time varying mode. The time varying mode can be pulsed mode, where the voltage is varied over time, for example by having alternating bias voltage turned on and bias voltage turned off. The percentage "on-time", i.e., the time during which the bias is applied, out of the total time for a bias pulse period during a deposition is called the "duty cycle".

The frequency of the bias voltage in pulsed mode is normally expressed in kHz.

In the area of cutting tools for metal machining commonly used PVD coatings are nitrides, carbonitrides and carboxynitrides of metals of group 4, 5 and 6 in the periodic table of elements and Al and Si.

Although there are many times desired a certain level of compressive residual stress in a PVD layer, it should preferably not be too high due to risk of adverse effects on adhesion to an underlying layer or substrate.

There is a continuing demand for coated cutting tools in which the coating has excellent properties in terms of adhesion to the substrate and flaking resistance, and also excellent wear resistance, such as crater wear resistance and/or flank wear resistance.

There is, furthermore, a need for an arc evaporation deposited PVD layer which besides having the general benefits from an arc evaporation deposited layer, such as good adhesion to the substrate, furthermore has a low level of lattice defects, such as low point defect density.

SUMMARY

The present invention relates to a method for producing a coating on a substrate, the coating comprises a PVD layer (A) being a compound of the formula $Me_xSi_yAl_zC_aN_bO_c$, $x+y+z=1$, $0 \le a \le 1$, $0 \le b \le 1$, $0 \le c \le 0.2$, $a+b+c=1$, and, $0 \le x \le 1$, $0 \le y \le 0.4$, $0 \le z \le 0.1$, or, $0 \le x \le 1$, $0 \le y \le 0.1$, $0 \le z \le 0.75$,
wherein Me is one or more metals of groups 4, 5 and 6 in the IUPAC periodic table of elements, the PVD layer (A) is deposited by by cathodic arc evaporation applying a pulsed bias voltage of from about −40 to about −450 V to the substrate and using a duty cycle of less than about 12% and a pulsed bias frequency of less than about 10 kHz.

Definitions

By the term "duty cycle" is meant the percentage of time that the bias voltage is "on", i.e., active, during a complete pulse period ("on-time"+"off-time").

By the term "pulse bias frequency" is meant the number of complete pulse period per second.

By the term "FWHM" is meant "Full Width at Half Maximum", which is the width, in degrees (2theta), of an X-ray diffraction peak at half its peak intensity.

By the term "FWQM" is meant "Full Width at Quarter Maximum", which is the width, in degrees (2theta), of an X-ray diffraction peak at a quarter of its peak intensity.

DETAILED DESCRIPTION

Figure 1:
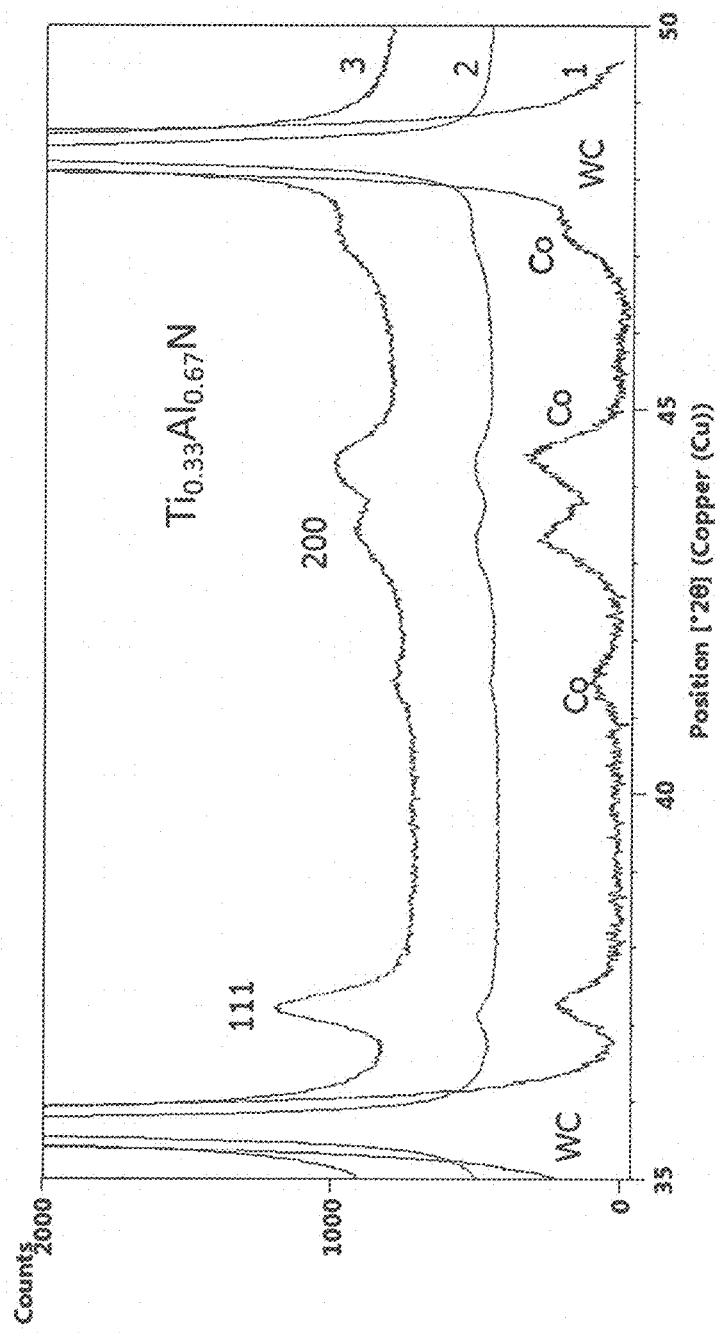
FIG. 1 shows combined X-ray diffractograms for the coatings of Samples 1-3.

The present invention relates to a method for producing a coating on a substrate, the coating comprises a PVD layer (A) being a compound of the formula $Me_xSi_yAl_zC_aN_bO_c$, x+y+z=1, 0≤a≤1, 0≤b≤1, 0≤c≤0.2, a+b+c=1, and, 0≤x≤1, 0≤y≤0.4, 0≤z≤0.1, or, 0≤x≤1, 0≤y≤0.1, 0≤z≤0.75, wherein Me is one or more metals of groups 4, 5 and 6 in the IUPAC periodic table of elements, the PVD layer (A) is deposited by by cathodic arc evaporation applying a pulsed bias voltage of from about −40 to about −450 V to the substrate and using a duty cycle of less than about 12% and a pulsed bias frequency of less than about 10 kHz.

In one embodiment the duty cycle can be less than about 11%. The duty cycle can further be from about 1.5 to about 10%, or from about 2 to about 10%.

In one embodiment the duty cycle can be less than about 10%. The duty cycle can further be from 1.5 to about 8%, or from about 2 to about 6%.

During the "off-time" the potential is suitably floating.

The pulsed bias frequency can be more than about 0.1 kHz, or from about 0.1 to about 8 kHz, or from about 1 to about 6 kHz, or from about 1.5 to about 5 kHz, or from about 1.75 to about 4 kHz.

The pulsed bias voltage can be from about −40 to about −450 V, or from about −50 to about −450 V, or from about −55 to about −450 V.

The most optimal range for the pulsed bias voltage to be used may vary depending on the specific PVD reactor used.

In one embodiment the pulsed bias voltage can be from about −55 to about −400 V, or from about −60 to about −350 V, or from about −70 to about −325 V, or from about −75 to about −300 V, or from about −75 to about −250 V, or from about −100 to about −200 V.

In another embodiment the pulsed bias voltage can be from about −45 to about −400 V, or from about −50 to about −350 V, or from about −50 to about −300 V, The pulsed bias voltage is suitably unipolar.

The PVD layer (A) is suitably deposited at a chamber temperature of between 400 and 700° C., or between 400-600° C., or between 450-550° C.

The PVD layer (A) is suitably deposited in a PVD vacuum chamber as disclosed in US 2013/0126347 A1 equipped with cathode assemblies where the cathodes are both provided with a ring-shaped anode placed around them, and using a system providing a magnetic field with field lines going out from the target surface and entering the anode.

The gas pressure during the deposition of the PVD layer (A) can be from about 0.5 to about 15 Pa, or from about 0.5 to about 10 Pa, or from about 1 to about 5 Pa.

The substrate can be selected from the group of cemented carbide, cermet, ceramic, cubic boron nitride and high speed steel.

The substrate is suitably shaped as a cutting tool.

The cutting tool can be a cutting tool insert, a drill, or a solid end-mill, for metal machining.

The present invention further relates to a coated cutting tool comprising a substrate and a coating, wherein the coating comprises a PVD layer (A) being a compound of the formula $Me_xSi_yAl_zC_aN_bO_c$, wherein, x+y+z=1, 0≤a≤1, 0≤b≤1, 0≤c≤0.2, a+b+c=1, and, 0≤x≤1, 0≤y≤0.4, 0≤z≤0.1, or, 0≤x≤1, 0≤y≤0.1, 0≤z≤0.75, wherein Me is one or more metals of groups 4, 5 and 6 in the IUPAC periodic table of elements, the PVD layer (A) is crystalline having a FWHM (Full Width at Half Maximum) value for the cubic (111) peak in X-ray diffraction being 0.3 degrees (2theta). The further possible features of the PVD layer (A) described herein refer to both the PVD layer (A) defined in method and to the PVD layer (A) defined in the coated cutting tool.

Very sharp cubic diffraction peaks are seen when performing X-ray diffraction analysis of the PVD layer (A). This implies high crystallinity. One also suitably gets a preferred (111) out-of-plane crystallographic orientation for a number of layer compositions where one usually gets a preferred (200) orientation by prior art methods. Such layer compositions are, for example, $Ti_{0.33}Al_{0.67}N$, $Ti_{0.5}Al_{0.5}N$, (Ti,Si)N and $Cr_{0.3}Al_{0.7}N$.

The PVD layer (A) suitably has a FWHM value for the cubic (111) peak in XRD diffraction being 0.25 degrees (2theta), or ≤0.2 degrees (2theta), or ≤0.18 degrees (2theta). For a case when the PVD layer (A) is TiN the FWHM value for the cubic (111) peak in XRD diffraction can furthermore even be ≤0.16 degrees (2theta).

The PVD layer (A) suitably has a FWQM (Full Width at Quarter Maximum) value for the cubic (111) peak in XRD diffraction being ≤0.6 degrees (2theta), or ≤0.5 degrees (2theta), or ≤0.45 degrees (2theta), or ≤0.4 degrees (2theta), or ≤0.35 degrees (2theta), or ≤0.3 degrees (2theta). For a case when the PVD layer (A) is TiN the FWQM value for the cubic (111) peak in XRD diffraction can furthermore even be ≤0.25 degrees (2theta).

The PVD layer (A) suitably has a ratio of peak height intensity I(111)/I(200) in X-ray diffraction being ≥0.6, or ≥0.7, or ≥0.8, or ≥0.9, or ≥1, or ≥1.5, or ≥2, or ≥3, or ≥4.

The peak height intensities I(111) and I(200) used herein, as well as the (111) peak used for determining the FWHM and FWQM values are $Cu-K_{\alpha 2}$ stripped.

The PVD layer (A), suitably has a residual stress being >−3 GPa, or >−2 GPa, or >−1 GPa, or >−0.5 GPa, or >0 GPa.

The PVD layer (A), suitably has a residual stress being <4 GPa, or <3 GPa, or <2 GPa, or <1 GPa.

The residual stress of the PVD layer (A) is evaluated by X-ray diffraction measurements using the well-known $\sin^2\psi$ method as described by I. C. Noyan, J. B. Cohen, Residual Stress Measurement by Diffraction and Interpretation, Springer-Verlag, New York, 1987 (pp 117-130). See also for example V Hauk, Structural and Residual Stress analysis by Nondestructive Methods, Elsevier, Amsterdam, 1997. The measurements are performed using CuKα-radiation on the (200) reflection. The side-inclination technique (ψ-geometry) has been used with six to eleven, preferably eight, ψ-angles, equidistant within a selected $\sin^2\psi$-range. An equidistant distribution of ϕ-angles within ϕ-sector of 90° is preferred. To confirm a biaxial stress state, the sample shall be rotated for ϕ=0 and 90° while tilted in ψ. It is recommended to investigate the possible presence of shear stresses and therefore both negative and positive ψ-angles shall be measured. In the case of an Euler ¼-cradle this is accomplished by measuring the sample also at ϕ=180 and 270° for the different ψ-angles. The measurement shall be performed on an as flat surface as possible, preferably on a flank side of a cutting tool insert. For the calculations of the residual stress values the Possion's ratio, v=0.22 and the Young's modulus, E=447 GPa are to be used. The data is evaluated using commercially available software such as DIFF- RAC$^{Plus}$ Leptos v. 7.8 from Bruker AXS preferably locating the (200) reflection, by the Pseudo-Voigt-Fit function. The total stress value is calculated as the average of the obtained biaxial stresses.

The PVD layer (A) suitably comprises faceted crystal grains on its surface. By faceted is herein meant that there are flat faces on the grains.

The faceted crystal grains of the PVD layer (A) suitably occupy >50%, or >75%, or >90%, of the surface area of the PVD layer (A).

The thickness of the PVD layer (A) is suitably from about 0.5 to about 20 μm, or from about 0.5 to about 15 μm, or from about 0.5 to about 10 μm, or from about 1 to about 7 μm, or from about 2 to about 5 μm.

The PVD layer (A) is suitably a compound of the formula $Ti_pZr_qCr_rSi_sAl_tC_aN_bO_c$, $0 \leq p \leq 1$, $0 \leq q \leq 1$, $0 \leq r \leq 1$, $0 \leq s \leq 0.4$, $0 \leq t \leq 0.1$, $p+q+r+s+t=1$, $0 \leq a \leq 1$, $0 \leq b \leq 1$, $0 \leq c \leq 0.2$, $a+b+c=1$ or, $Ti_pZr_qCr_rSi_sAl_tC_aN_bO_c$, $0 \leq p \leq 1$, $0 \leq q \leq 1$, $0 \leq r \leq 1$, $0 \leq s \leq 0.1$, $0 \leq t \leq 0.75$, $p+q+r+s+t=1$, $0 \leq a \leq 1$, $0 \leq b \leq 1$, $0 \leq c \leq 0.2$, $a+b+c=1$.

Suitably, in the formula for the PVD layer (A), $0 \leq a \leq 0.75$, $0.25 \leq b \leq 1$, $0 \leq c \leq 0.1$, or, $0 \leq a \leq 0.5$, $0.5 \leq b \leq 1$, $0 \leq c \leq 0.1$, or, $0 \leq a \leq 0.25$, $0.75 \leq b \leq 1$, $0 \leq c \leq 0.05$, or, $0 \leq a \leq 0.1$, $0.9 \leq b \leq 1$, $0 \leq c \leq 0.02$, or, $a=0$, $b=1$, $c=0$, $a+b+c=1$.

In one embodiment, the PVD layer (A) is a compound comprising at least two of Ti, Zr, Cr, Si, and Al.

In one embodiment, in the formula for the PVD layer (A) $0.95 \leq p \leq 1$, $0 \leq q \leq 0.1$, $0 \leq r \leq 0.1$, $0 \leq s \leq 0.1$, $0 \leq t \leq 0.1$, or, $0.955 \leq p \leq 1$, $0 \leq q \leq 0.05$, $0 \leq r \leq 0.05$, $0 \leq s \leq 0.05$, $0 \leq t \leq 0.05$, or, $0.985 \leq p \leq 1$, $0 \leq q \leq 0.02$, $0 \leq r \leq 0.02$, $0 \leq s \leq 0.02$, $0 \leq t \leq 0.02$. In this embodiment an example of the PVD layer (A) is TiN.

In one embodiment, in the formula for the PVD layer (A) $0.255 \leq p \leq 0.9$, $0 \leq q \leq 0.1$, $0 \leq r < 0.1$, $05 \leq s \leq 0.1$, $0.1 \leq t \leq 0.75$, or, $0.35 \leq p \leq 0.7$, $0 \leq q \leq 0.05$, $0 \leq r \leq 0.05$, $0 \leq s \leq 0.05$, $0.3 \leq t \leq 0.7$, or, $0.335 \leq p \leq 0.6$, $0 \leq q \leq 0.02$, $0 \leq r \leq 0.02$, $0 \leq s \leq 0.02$, $0.4 \leq t \leq 0.67$. In this embodiment an example of the PVD layer (A) is $Ti_{0.3}Al_{0.67}N$.

In one embodiment, in the formula for the PVD layer (A) $0 \leq p \leq 0.1$, $0 \leq q \leq 0.1$, $0.2 \leq r \leq 1$, $0 \leq s \leq 0.1$, $0.1 \leq t \leq 0.8$, or, $0 \leq p \leq 0.05$, $0 \leq q \leq 0.05$, $0.25 \leq r \leq 0.75$, $0 \leq s \leq 0.05$, $0.3 \leq t \leq 0.75$, or, $0 \leq p \leq 0.02$, $0 \leq q \leq 0.02$, $0.25 \leq r \leq 0.35$, $0 \leq s \leq 0.05$, $0.6 \leq t \leq 0.75$. In this embodiment an example of the PVD layer (A) is $Cr_{0.3}Al_{0.7}N$.

In one embodiment, in the formula for the PVD layer (A) $0.1 \leq p \leq 0.5$, $0.1 \leq q \leq 0.5$, $0 \leq r \leq 0.1$, $0 \leq s \leq 0.1$, $0.25 \leq t \leq 0.6$, or, $0.15 \leq p \leq 0.4$, $0.155 \leq q \leq 0.4$, $0 \leq r \leq 0.05$, $0 \leq s \leq 0.05$, $0.4 \leq t \leq 0.55$, or, $0.2 \leq p \leq 0.4$, $0.15 \leq q \leq 0.3$, $0 \leq r \leq 0.02$, $0 \leq s \leq 0.02$, $0.45 \leq t \leq 0.55$. In this embodiment an example of the PVD layer (A) is $Ti_{0.3}Zr_{0.2}Al_{0.5}N$.

In one embodiment, in the formula for the PVD layer (A) $0 \leq p \leq 0.1$, $0.4 \leq q \leq 1$, $0 \leq r \leq 0.1$, $0 \leq s \leq 0.1$, $0 \leq t \leq 0.5$, or, $0 \leq p \leq 0.05$, $0.5 \leq q \leq 1$, $0 \leq r \leq 0.05$, $0 \leq s \leq 0.05$, $0.1 \leq t \leq 0.45$, or, $0 \leq p \leq 0.02$, $0.5 \leq q \leq 0.8$, $0 \leq r \leq 0.02$, $0 \leq s \leq 0.02$, $0.2 \leq t \leq 0.4$. In this embodiment an example of the PVD layer (A) is $Zr_{0.65}Al_{0.35}N$.

In one embodiment, in the formula for the PVD layer (A) $0.25 \leq p \leq 0.6$, $0 \leq q \leq 0.1$, $0 \leq r \leq 0.1$, $0 \leq s \leq 0.1$, $0.35 \leq t \leq 0.75$, or, $0.3 \leq p \leq 0.5$, $0 \leq q \leq 0.05$, $0 \leq r \leq 0.05$, $0.01 \leq s \leq 0.08$, $0.4 \leq t \leq 0.6$, or, $0.3 \leq p \leq 0.5$, $0 \leq q \leq 0.02$, $0 \leq r \leq 0.02$, $0.02 \leq s \leq 0.07$, $0.45 \leq t \leq 0.6$. In this embodiment an example of the PVD layer (A) is $Ti_{0.4}Si_{0.05}Al_{0.55}N$.

In one embodiment, in the formula for the PVD layer (A) $0.75 \leq p \leq 0.95$, $0 \leq q \leq 0.1$, $0 \leq r \leq 0.1$, $0.01 \leq s \leq 0.3$, $0 \leq t \leq 0.1$, or, $0.755 \leq p \leq 0.95$, $0 \leq q \leq 0.05$, $0 \leq r \leq 0.05$, $0.02 \leq s \leq 0.25$, $0 \leq t \leq 0.05$, or, $0.85 \leq p \leq 0.95$, $0 \leq q \leq 0.02$, $0 \leq r \leq 0.02$, $0.05 \leq s \leq 0.2$. In this embodiment examples of the PVD layer (A) are, $Ti_{0.91}Si_{0.09}N$ $Ti_{0.87}Si_{0.13}N$, $Ti_{0.85}Si_{0.15}N$, $Ti_{0.82}Si_{0.18}N$, and $Ti_{0.78}Si_{0.22}N$.

The coating comprising a PVD layer (A) is suitably deposited on a substrate selected from the group of cemented carbides, cermets, ceramics, cubic boron nitride and high speed steel.

The PVD layer (A) in the coating of the coated cutting tool is suitably deposited by arc evaporation.

The PVD layer (A) in the coating of the coated cutting tool is suitably deposited according to the method of the invention.

In one embodiment the coating comprises an innermost bonding layer of, e.g., TiN, CrN or ZrN, closest to the substrate. The thickness of the bonding layer can be from about 0.1 to about 1 μm, or from about 0.1 to about 0.5 μm. An innermost bonding layer may be deposited using different process parameters than used for depositing the PVD layer (A), for example DC bias instead of pulsed bias, such an innermost bonding layer may be of substantially the same elemental composition as the PVD layer (A).

The substrate of the coated cutting tool can be selected from the group of cemented carbide, cermet, ceramic, cubic boron nitride and high speed steel.

The coated cutting tool can be a cutting tool insert, a drill, or solid end-mill, for metal machining.

EXAMPLES

Example 1

A $Ti_{0.33}Al_{0.67}N$ layer was deposited on sintered cemented carbide cutting tool insert blanks of the geometry SNMA120804. The composition of the cemented carbide was 10 wt % Co, 0.4 wt % Cr and rest WC. The cemented carbide blanks were coated in a PVD vacuum chamber being Oerlikon Balzer INNOVA System with the Advanced Plasma Optimizer upgrade. The PVD vacuum chamber was equipped with 6 cathode assemblies. The assemblies each comprised one $Ti_{0.33}Al_{0.67}$ alloy target. The cathode assemblies were placed on two levels in the chamber. The cathodes were both provided with a ring-shaped anode placed around them (as disclosed in US 2013/0126347 A1), with a system providing a magnetic field with field lines going out from the target surface and entering the anode (see US 2013/0126347 A1).

The chamber was pumped down to high vacuum (less than $10^{-2}$ Pa) and heated to 350-500° C. by heaters located inside the chamber, in this specific case 500° C. The blanks were then etched for 30 minutes in an Ar plasma.

Seventeen different depositions were made with varying process conditions. Both DC bias and pulsed bias voltage was tested. For the pulsed bias different bias voltages, duty cycles and pulsed bias frequencies were tested.

The chamber pressure was set to 3.5 Pa of $N_2$ gas, and either a certain DC bias voltage or unipolar pulsed bias voltage (relative to the chamber walls) was applied to the blank assembly. For the pulsed bias, at a certain duty cycle and pulsed bias frequency. The cathodes were run in an arc discharge mode at a current of 200 A (each) for 60 minutes. A layer having a thickness of about 3 μm was deposited.

The different combination of process parameters are shown in Table 1.

TABLE 1

$Ti_{0.33}Al_{0.67}N$ layers

| Sample No. | Bias voltage (V) | on-time (μs) | off-time (μs) | Duty cycle (%) | Pulsed bias frequency (kHz) | Pressure (Pa) |
|---|---|---|---|---|---|---|
| 1. (comparative) | −150 | NA | NA | NA | NA | 3.5 |
| 2. (comparative) | −100 | NA | NA | NA | NA | 3.5 |
| 3. (comparative) | −100 | NA | NA | NA | NA | 1 |
| 4. (invention) | −300 unipolar pulsed | 20 | 500 | 3.8 | 1.9 | 3.5 |
| 5. (invention) | −300 unipolar pulsed | 50 | 500 | 9.1 | 1.8 | 3.5 |
| 6. (invention) | −300 unipolar pulsed | 20 | 200 | 9.1 | 4.5 | 3.5 |
| 7. (comparative) | −300 unipolar pulsed | 20 | 100 | 16.7 | 8.3 | 3.5 |
| 8. (comparative) | −300 unipolar pulsed | 20 | 60 | 25 | 12.5 | 3.5 |
| 9. (comparative) | −300 unipolar pulsed | 3 | 30 | 9.1 | 30 | 3.5 |
| 10. (comparative) | −300 unipolar pulsed | 2 | 20 | 9.1 | 45 | 3.5 |
| 11. (comparative) | −300 unipolar pulsed | 2 | 45 | 4 | 20 | 3.5 |
| 12. (comparative) | −300 unipolar pulsed | 4 | 96 | 4 | 10 | 3.5 |
| 13. (invention) | −200 unipolar pulsed | 20 | 500 | 3.8 | 1.9 | 3.5 |
| 14. (invention) | −150 unipolar pulsed | 20 | 500 | 3.8 | 1.9 | 3.5 |
| 15. (invention) | −100 unipolar pulsed | 20 | 500 | 3.8 | 1.9 | 3.5 |
| 16. (invention) | −75 unipolar pulsed | 20 | 500 | 3.8 | 1.9 | 3.5 |
| 17. (invention) | −50 unipolar pulsed | 20 | 500 | 3.8 | 1.9 | 3.5 |

X-ray diffraction (XRD) analysis was conducted on the flank face of the coated inserts using a Bruker D8 Discover diffractometer equipped with a 2D detector (VANTEC-500) and a IμS X-ray source (Cu-K$_á$, 50.0 kV, 1.0 mA) with an integrated parallel beam Montel mirror. The coated cutting tool inserts were mounted in sample holders that ensure that the flank face of the samples were parallel to the reference surface of the sample holder and also that the flank face was at appropriate height. The diffracted intensity from the coated cutting tool was measured around 2θ angles where relevant peaks occur, so that at least 35° to 50° is included. Data analysis, including background subtraction and Cu-K$_{α2}$ stripping, was performed using PANalytical's X'Pert HighScore Plus software. A Pseudo-Voigt-Fit function was used for peak analysis. No thin film correction was applied to the obtained peak intensities. Possible peak overlap of a (111) or a (200) peak with any diffraction peak not belonging to the PVD layer, e.g., a substrate reflection like WC, was compensated for by the software (deconvolution of combined peaks) when determining the peak intensities and peak widths.

Figure 2:
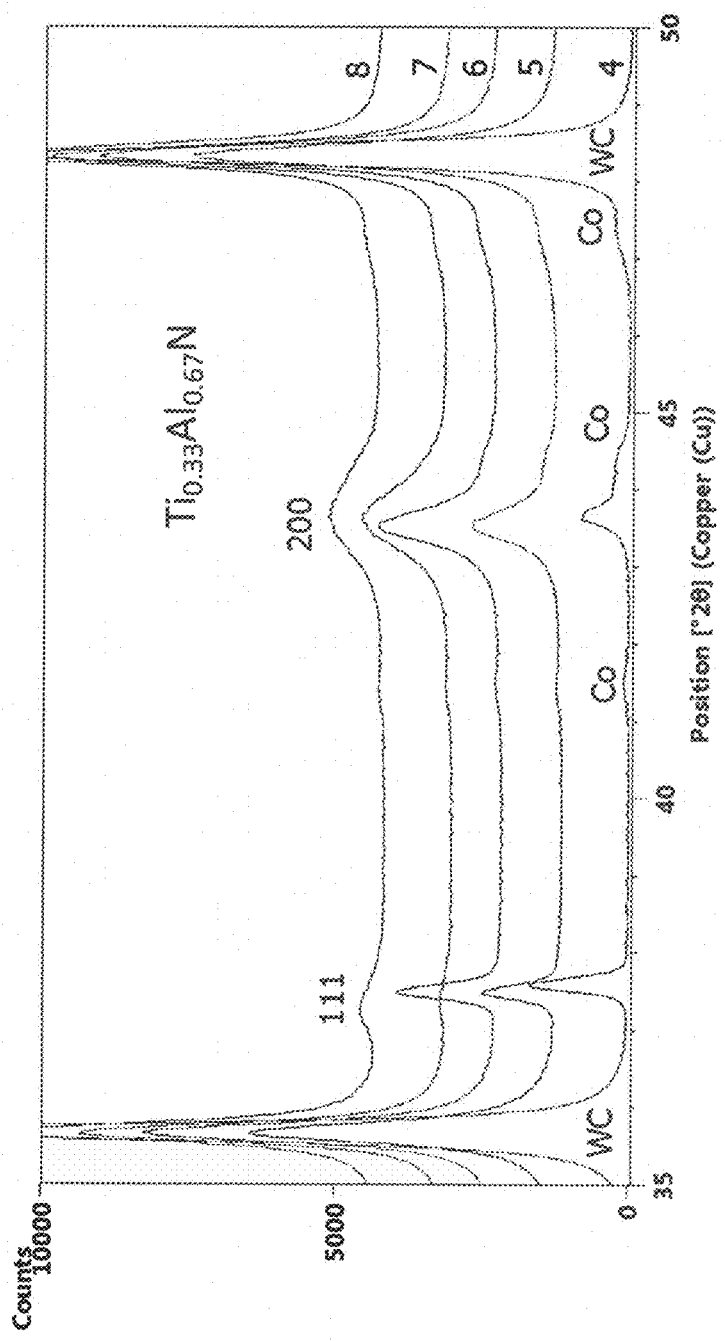
FIG. 2 shows combined X-ray diffractograms for the coatings of Samples 4-8.
Figure 3:
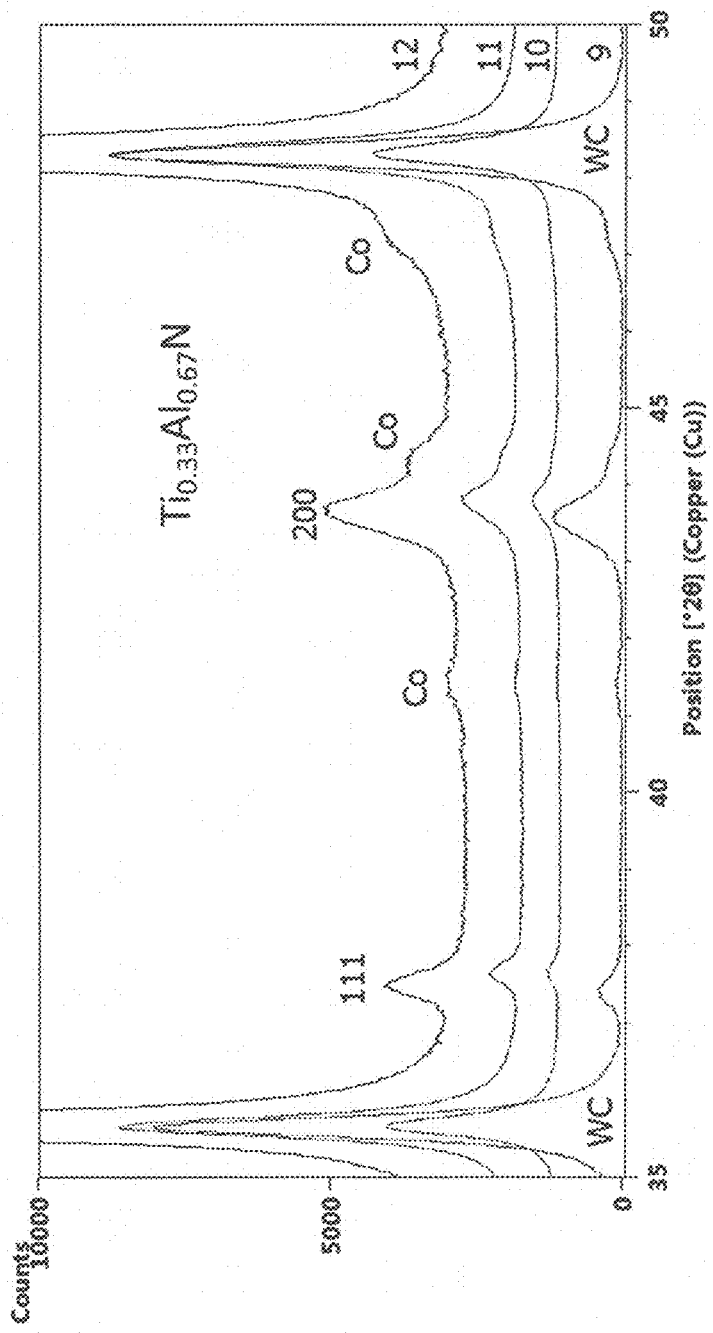
FIG. 3 shows combined X-ray diffractograms for the coatings of Samples 9-12.
Figure 4:
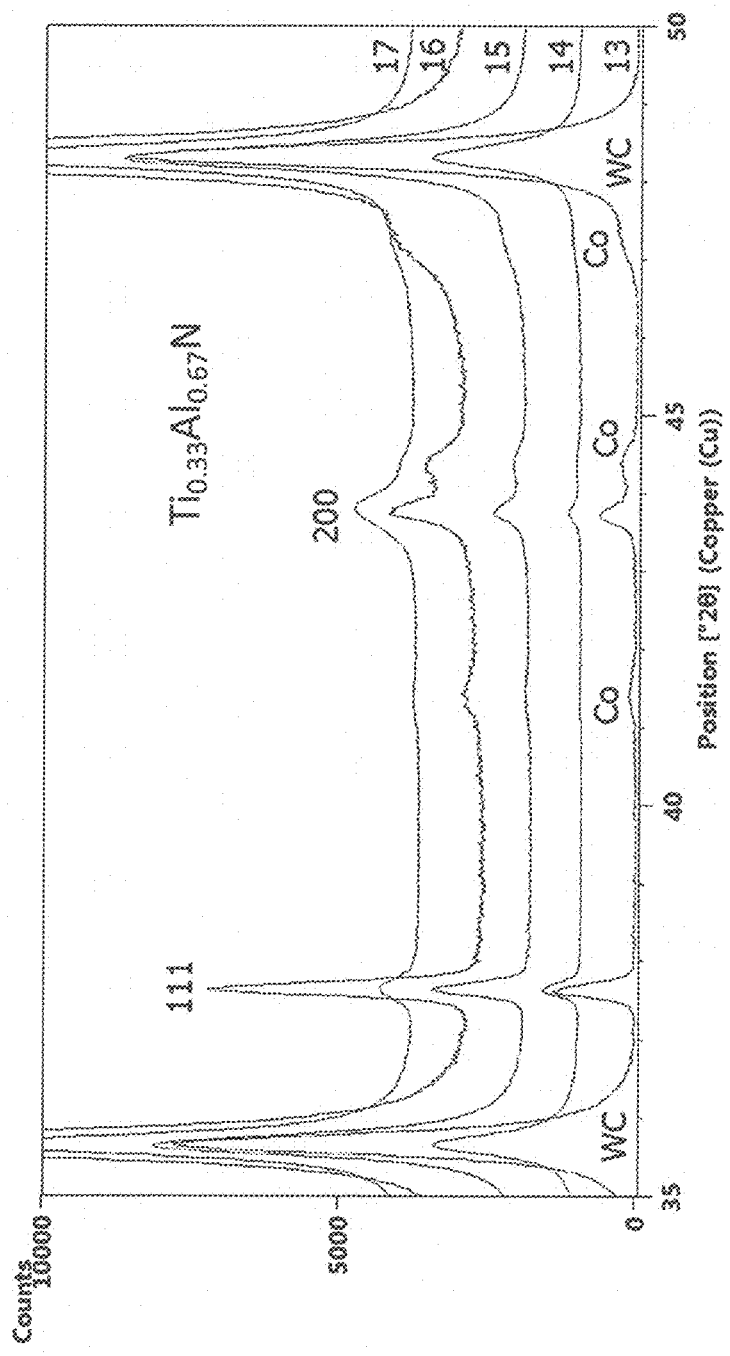
FIG. 4 shows combined X-ray diffractograms for the coatings of Samples 13-17.

FIG. 1 shows combined X-ray diffractograms (not Cu-K$_{α2}$ stripped) for the coatings Samples 1-3 where DC bias voltage has been used. FIG. 2 shows combined X-ray diffractograms (not Cu-K$_{α2}$ stripped) for the coatings Samples 4-8 where −300 V pulsed bias voltage has been used and the duty ratio and the pulsed bias frequency have been varied. FIG. 3 shows combined X-ray diffractograms (not Cu-K$_{α2}$ stripped) for the coatings Samples 9-12 where −300 V pulsed bias has been used and the duty ratio and the pulse frequency have been varied. FIG. 4 shows combined X-ray diffractograms (not Cu-K$_{α2}$ stripped) for the coatings Samples 13-17 where the pulsed bias voltage has been varied at fixed duty ratio and pulsed bias frequency.

Figure 5:
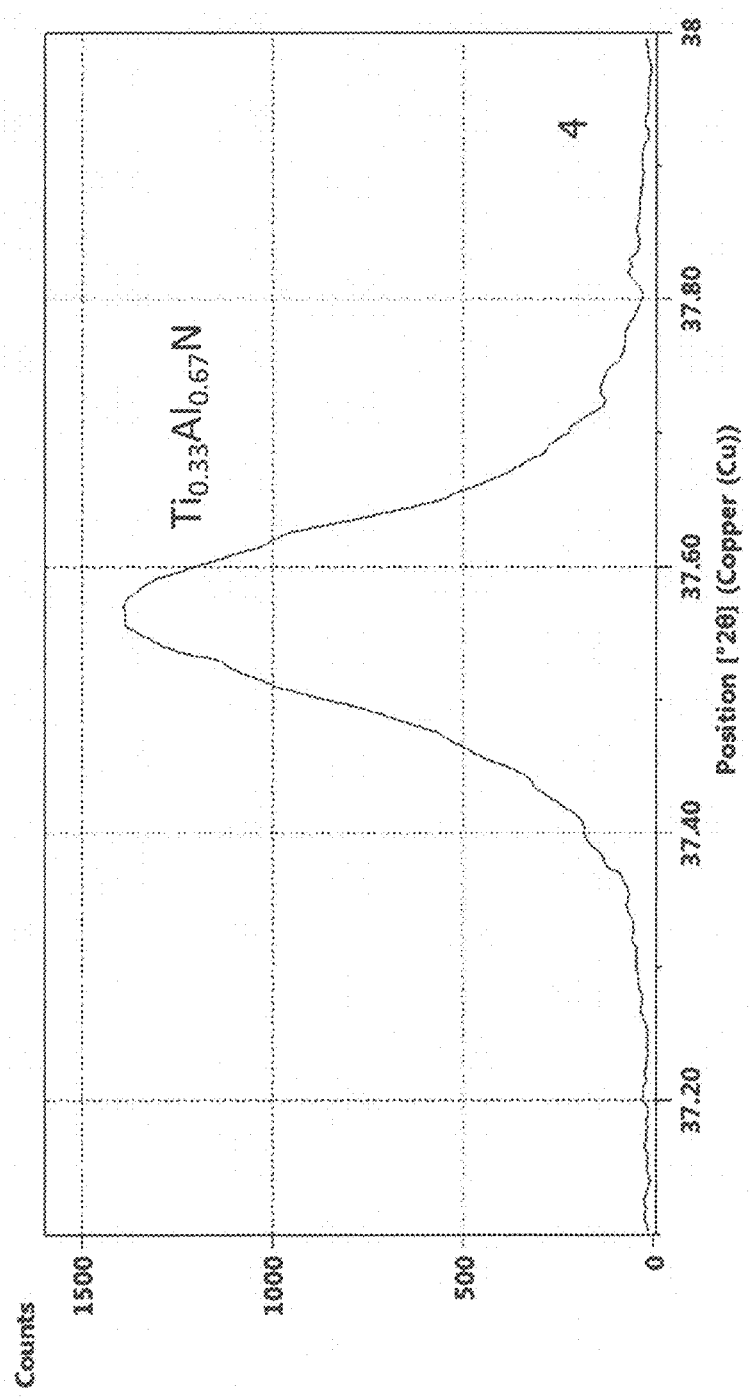
FIG. 5 shows an enlarged part of the X-ray diffractogram for Sample 4 around the (111) peak.
Figure 6:
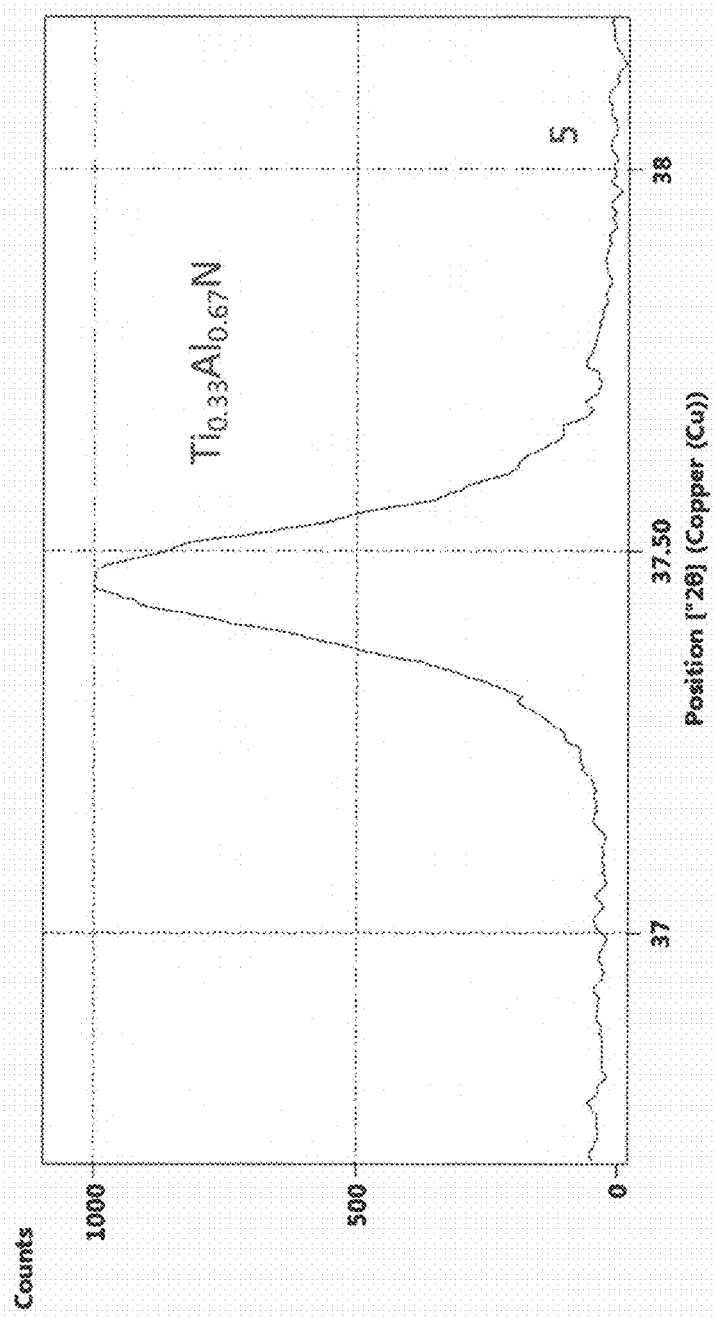
FIG. 6 shows an enlarged part of the X-ray diffractogram for Sample 5 around the (111) peak.
Figure 7:
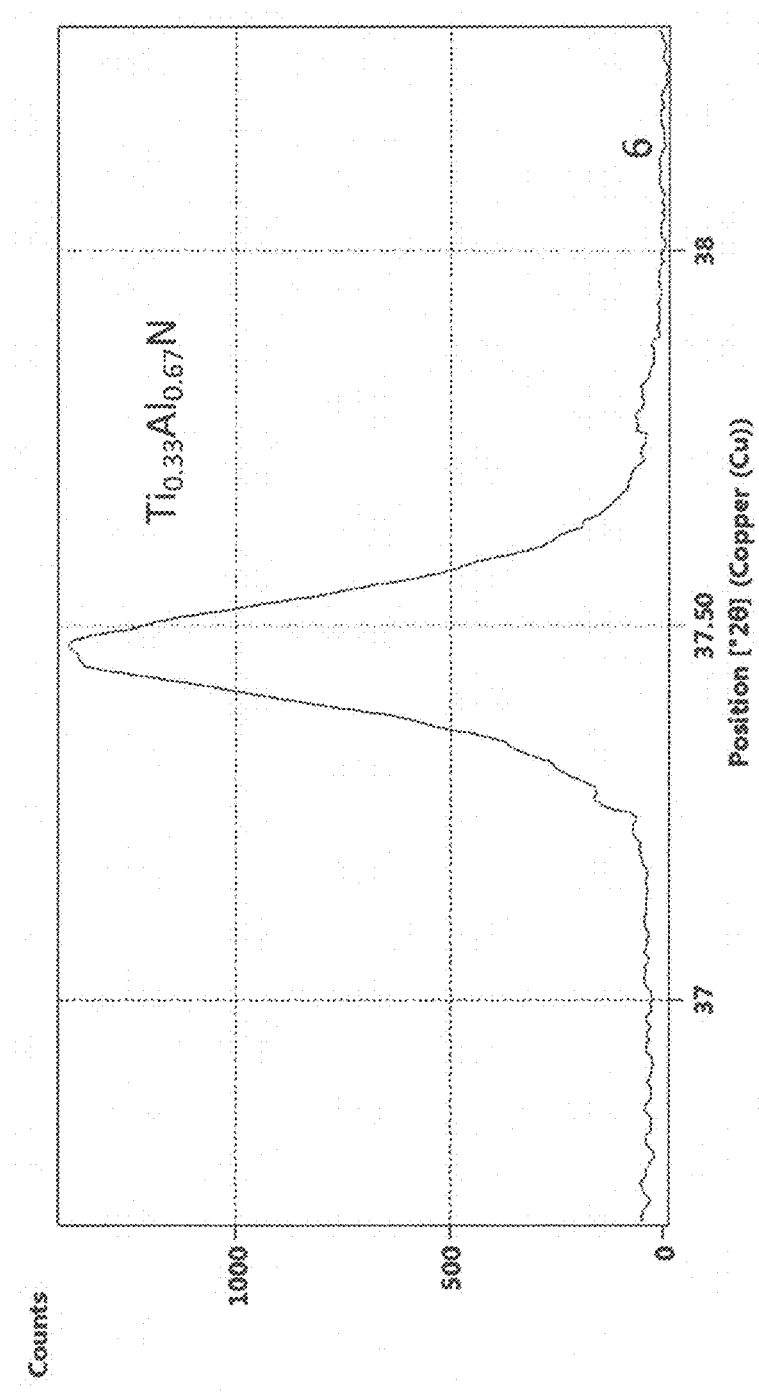
FIG. 7 shows an enlarged part of the X-ray diffractogram for Sample 6 around the (111) peak.
Figure 8:
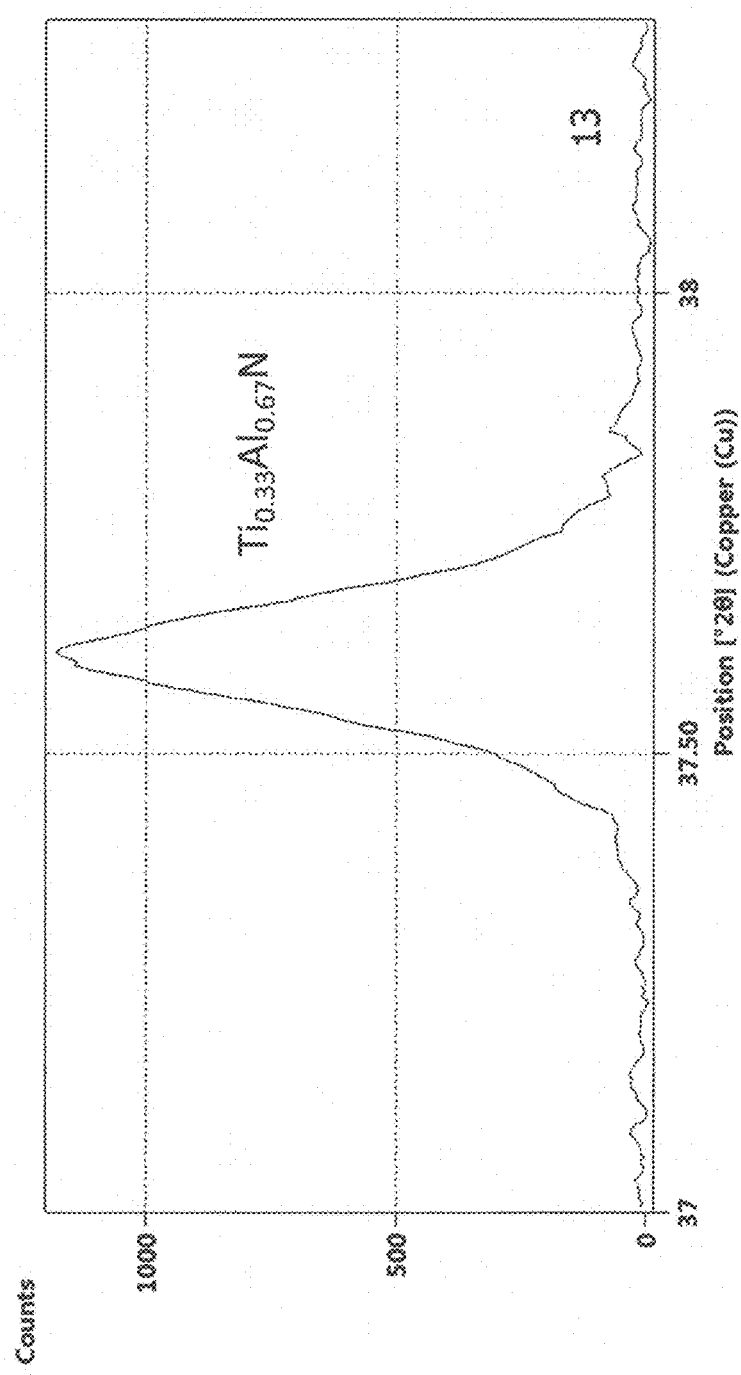
FIG. 8 shows an enlarged part of the X-ray diffractogram for Sample 13 around the (111) peak.
Figure 9:
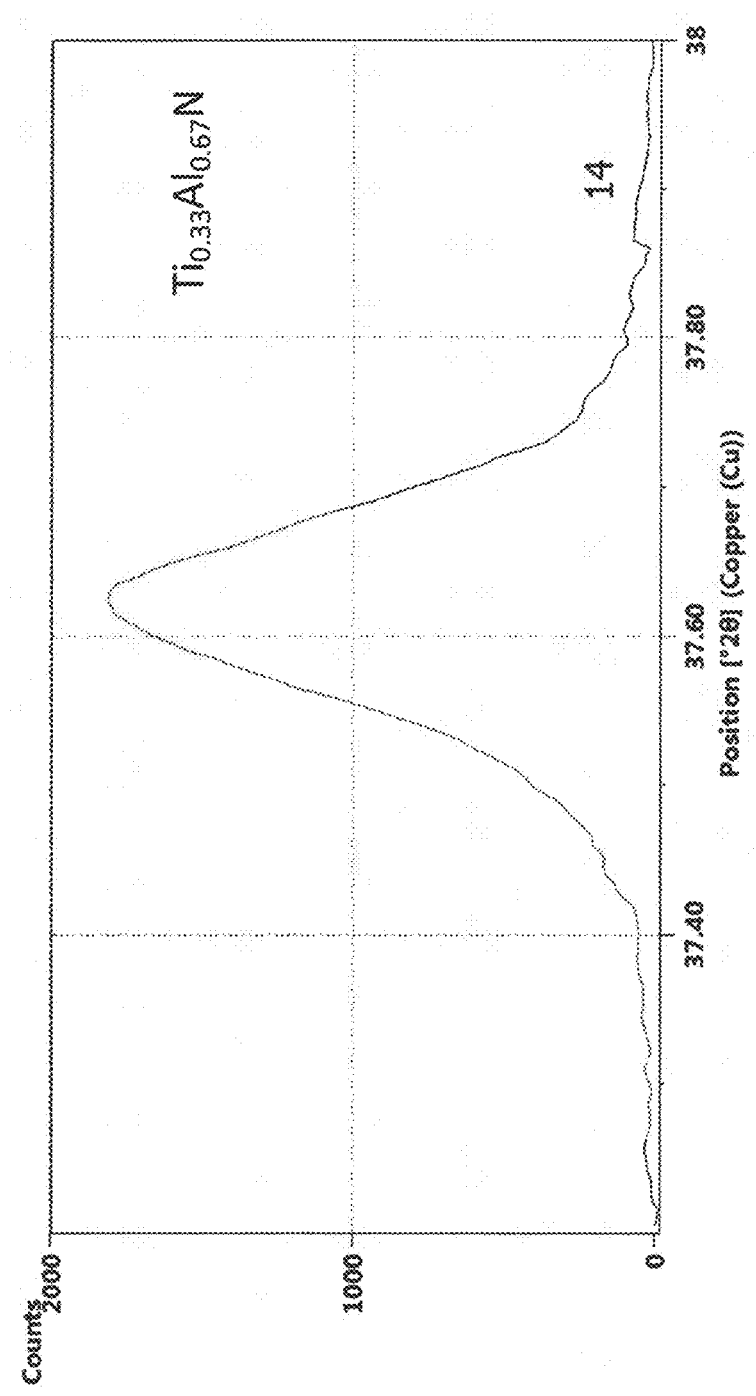
FIG. 9 shows an enlarged part of the X-ray diffractogram for Sample 14 around the (111) peak.
Figure 10:
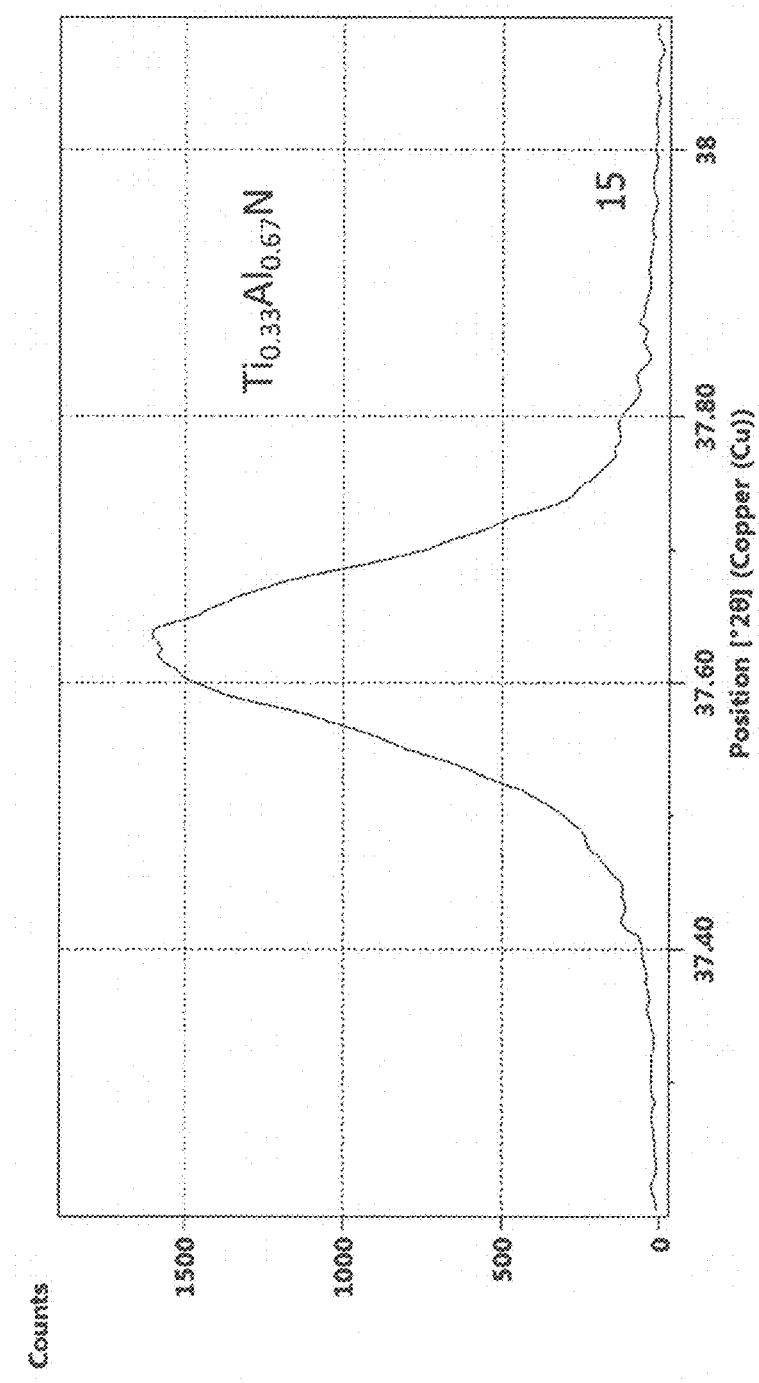
FIG. 10 shows an enlarged part of the X-ray diffractogram for Sample 15 around the (111) peak.
Figure 11:
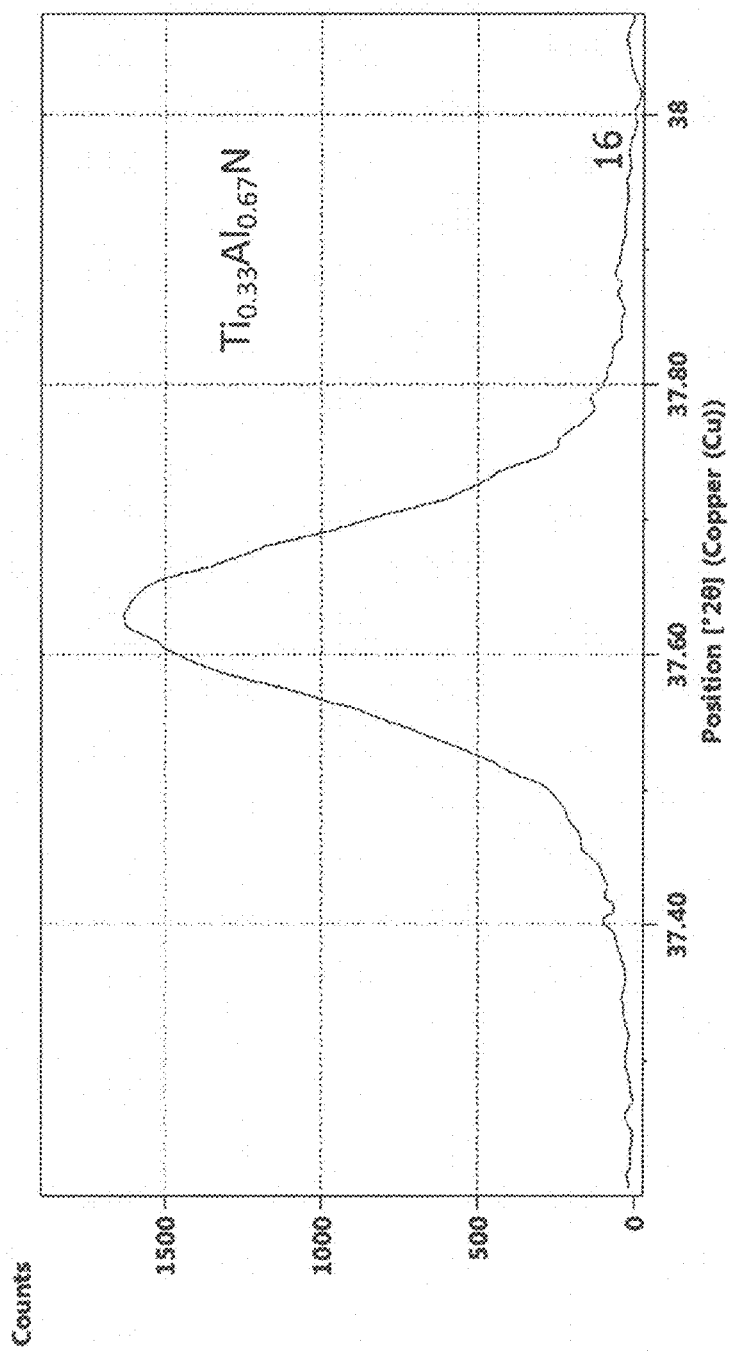
FIG. 11 shows an enlarged part of the X-ray diffractogram for Sample 16 around the (111) peak.

It is clear that Samples 4-6, and Samples 13-16 which were produced according to the invention show a sharp (111) peak. FIG. 5-7 show enlarged parts of the diffractograms for Samples 4-6 around the (111) peak (Cu-K$_{α2}$ stripped). FIG. 8-11 show enlarged parts of the diffractograms for Samples 13-16 around the (111) peak (Cu-K$_{α2}$ stripped). The FWHM and FWQM values for the (111) peak of Samples 4-6 and Samples 13-16 were determined as well as the ratio of I(111)/I(200).

Figure 12:
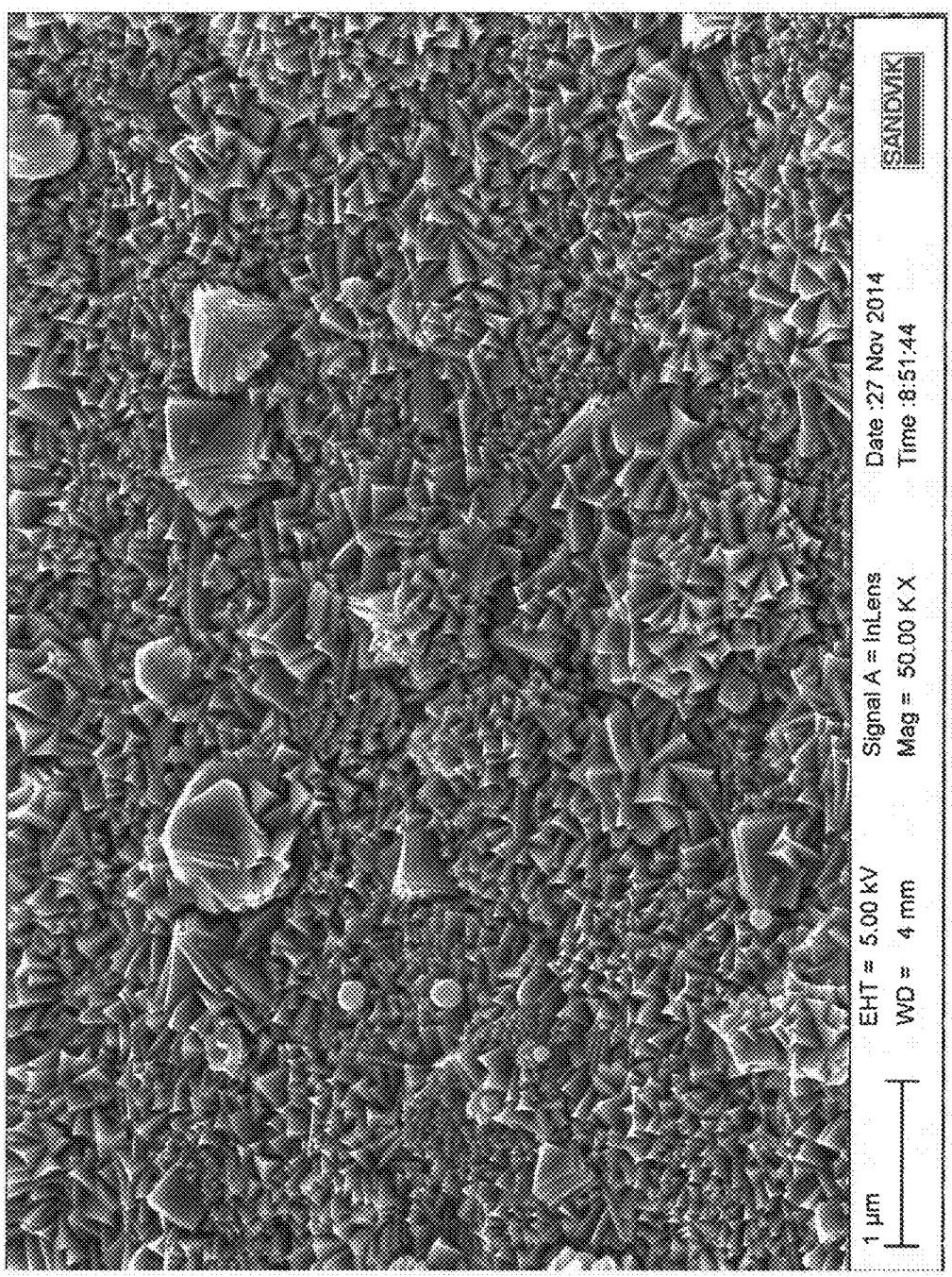
FIG. 12 shows a SEM image of the surface of Sample 4.

FIG. 12 shows a SEM image of the surface of Sample 4. The crystal grains are clearly facetted all over the surface.

The results are shown in Table 2.

TABLE 2

Results from SEM analysis, XRD analysis and residual stress analysis

| Sample No. | Faceted crystal grains on the surface | I(111)/I(200) peak height intensities | FWHM I(111), [°2θ] | FWQM I(111), [°2θ] | Residual stress* (GPa) |
|---|---|---|---|---|---|
| 1. (comparative) | no | 0.8 | 0.60 | 1.2 | −5.5 |
| 2. (comparative) | no | 1.0 | 0.35 | 0.65 | |
| 3. (comparative) | no | 3.2 | 0.43 | 0.95 | |
| 4. (invention) | yes, all over | 2.5 | 0.16 | 0.27 | −0.5 |
| 5. (invention) | yes, all over | 1.0 | 0.18 | 0.27 | |
| 6. (invention) | yes, all over | 1.0 | 0.16 | 0.25 | |
| 7. (comparative) | no | 0.1 | 0.89 | — | |
| 8. (comparative) | no | 0.4 | 0.76 | 1.1 | |
| 9. (comparative) | no | 0.4 | 0.42 | 0.57 | |
| 10. (comparative) | no | 0.5 | 0.29 | 0.45 | |
| 11. (comparative) | no | 0.5 | 0.28 | 0.54 | |
| 12. (comparative) | no | 0.6 | 0.36 | 0.59 | |
| 13. (invention) | yes, all over | 2.7 | 0.15 | 0.34 | |
| 14. (invention) | yes, all over | 3.9 | 0.14 | 0.30 | |
| 15. (invention) | yes, all over | 3.4 | 0.15 | 0.31 | |
| 16. (invention) | yes, all over | 3.6 | 0.15 | 0.31 | |
| 17. (invention) | no | 0.6 | 0.29 | 0.52 | |

*only for Samples No. 1 and 4

Example 2

Layers as listed in Table 3 were respectively deposited on sintered cemented carbide cutting tool insert blanks of the geometry SNMA120804 with the same composition as in Example 1 and also using the same PVD vacuum chamber and the same procedure as in Example 1, but with changing the $Ti_{0.33}Al_{0.67}$ alloy targets to, respectively, Ti-targets, $Cr_{0.30}Al_{0.70}$ alloy targets, $Ti_{0.30}Zr_{0.20}Al_{0.50}$ alloy targets, $Zr_{0.65}Al_{0.35}$ alloy targets, or $Ti_{0.85}Si_{0.15}$ alloy targets. The same bias and pressure parameters as for Sample 4 in Example 1 was used. See Table 3.

It is concluded that Samples 18-23 give coatings with very narrow (111) peaks in X-ray diffraction.

The invention claimed is:

1. A coated cutting tool comprising:
   a substrate; and
   a coating, wherein the coating comprises a PVD layer being a compound of the formula $Me_xSi_yAl_zC_aN_bO_c$, wherein, $x+y+z=1$, $0 \leq a \leq 1$, $0 \leq b \leq 1$, $0 \leq c \leq 0.2$, $a+b+c=1$, and, $0 \leq x \leq 1$, $0 \leq y \leq 0.4$, $0 \leq z \leq 0.1$, or, $0 \leq x \leq 1$, $0 \leq y \leq 0.1$, $0 \leq z \leq 0.75$,
   wherein Me is one or more metals of groups 4, 5 and 6 in the IUPAC periodic table of elements, the PVD layer is crystalline having a FWHM (Full Width at Half Maximum) value for the cubic (111) peak in X-ray diffraction being ≤0.3 degrees (2theta).

2. The coated cutting tool according to claim 1, wherein the PVD layer has a FWHM value for the cubic (111) peak in X-ray diffraction being ≤0.25 degrees (2theta).

3. The coated cutting tool according to claim 1, wherein the PVD layer has a ratio of peak height intensity $I(111)/I(200)$ in X-ray diffraction being ≥0.6.

TABLE 3

| Sample No. | PVD layer composition* | Bias voltage (V) | On-time (µs) | Off-time (µs) | Duty cycle (%) | Pulsed bias frequency (kHz) | Pressure (Pa) |
|---|---|---|---|---|---|---|---|
| 18. (invention) | TiN | 300 unipolar pulsed | 20 | 500 | 3.8 | 1.9 | 3.5 |
| 19. (invention) | $Cr_{0.30}Al_{0.70}N$ | 300 unipolar pulsed | 20 | 500 | 3.8 | 1.9 | 3.5 |
| 20. (invention) | $Ti_{0.30}Zr_{0.20}Al_{0.50}N$ | 300 unipolar pulsed | 20 | 500 | 3.8 | 1.9 | 3.5 |
| 21. (invention) | $Zr_{0.65}Al_{0.35}N$ | 300 unipolar pulsed | 20 | 500 | 3.8 | 1.9 | 3.5 |
| 22. (invention) | $Ti_{0.85}Si_{0.15}N$ | 300 unipolar pulsed | 20 | 500 | 3.8 | 1.9 | 3.5 |
| 23. (invention) | $Ti_{0.40}Si_{0.05}Al_{0.55}N$ | 300 unipolar pulsed | 20 | 500 | 3.8 | 1.9 | 3.5 |

*based on target composition

Figure 13:
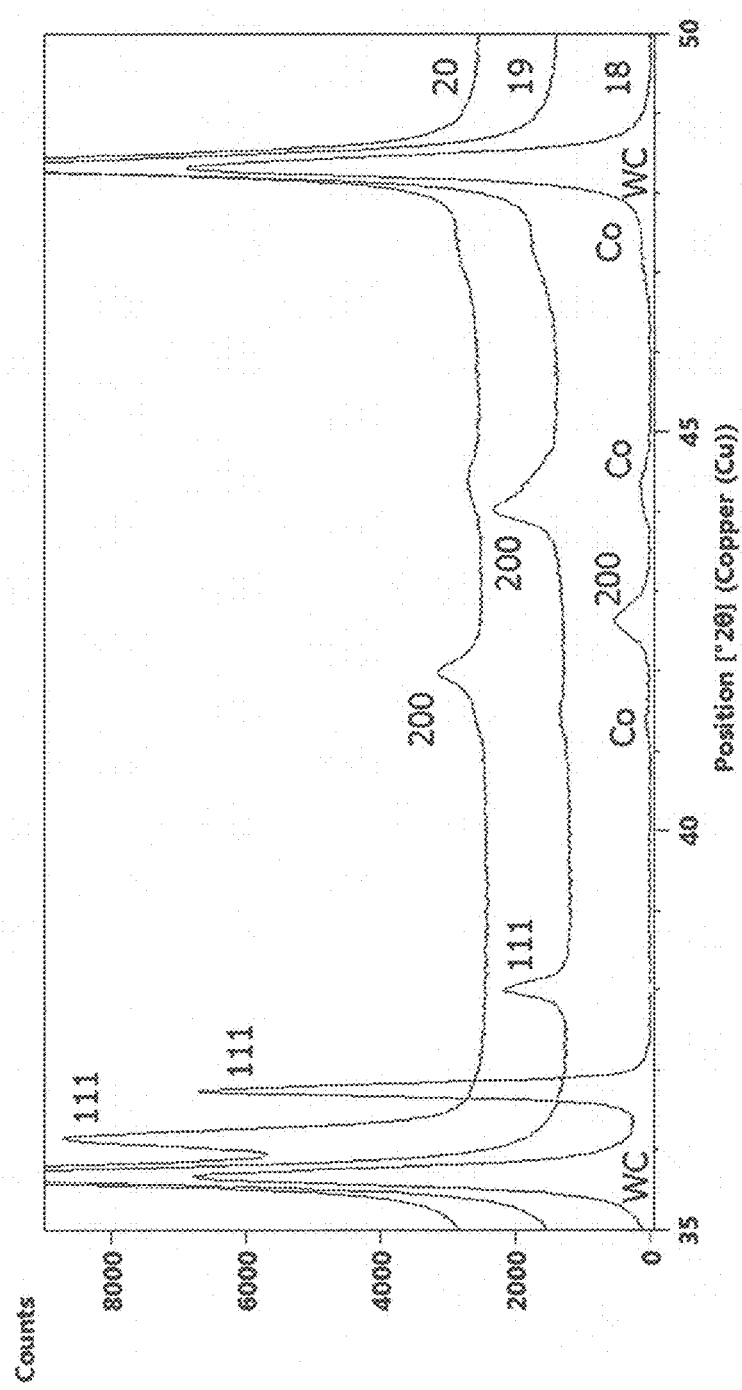
FIG. 13 shows combined X-ray diffractograms for the coatings of Samples 18-20.
Figure 14:
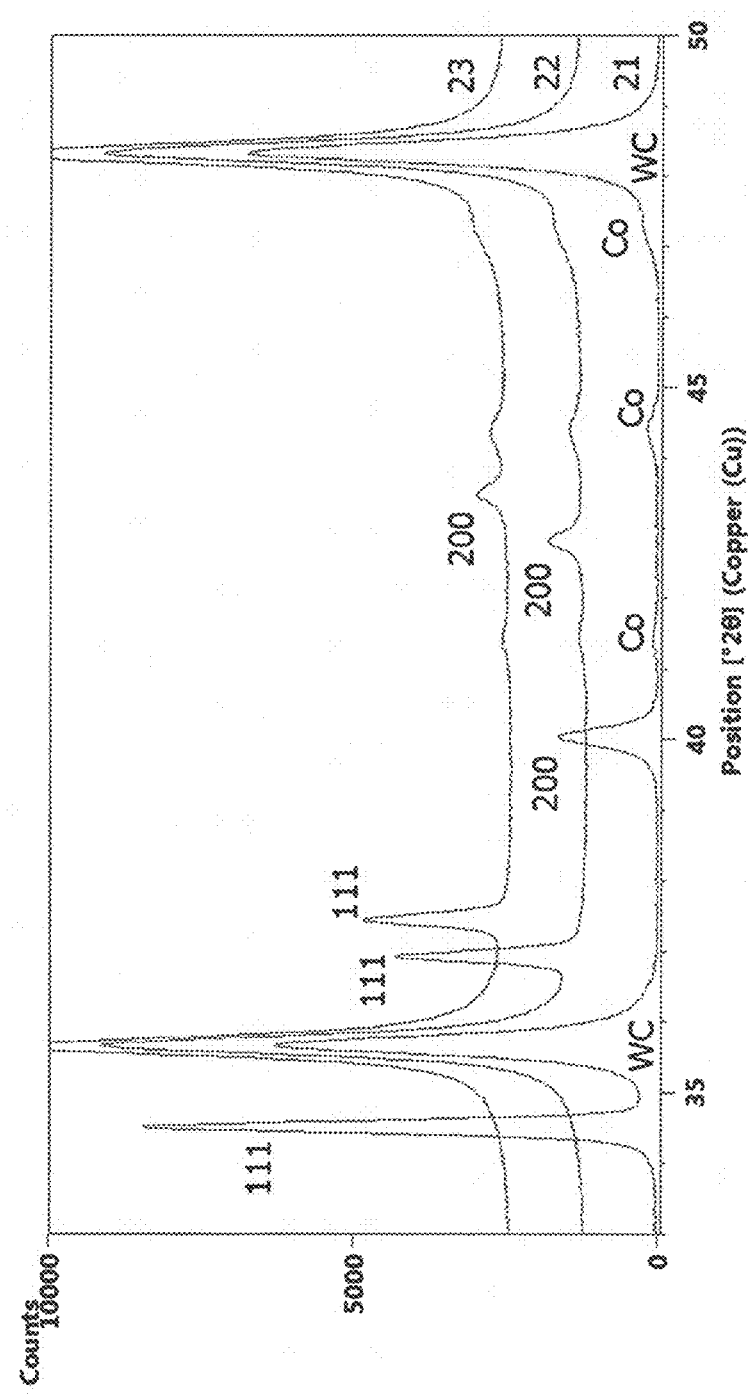
FIG. 14 shows combined X-ray diffractograms for the coatings of Samples 21-23.
Figure 15:
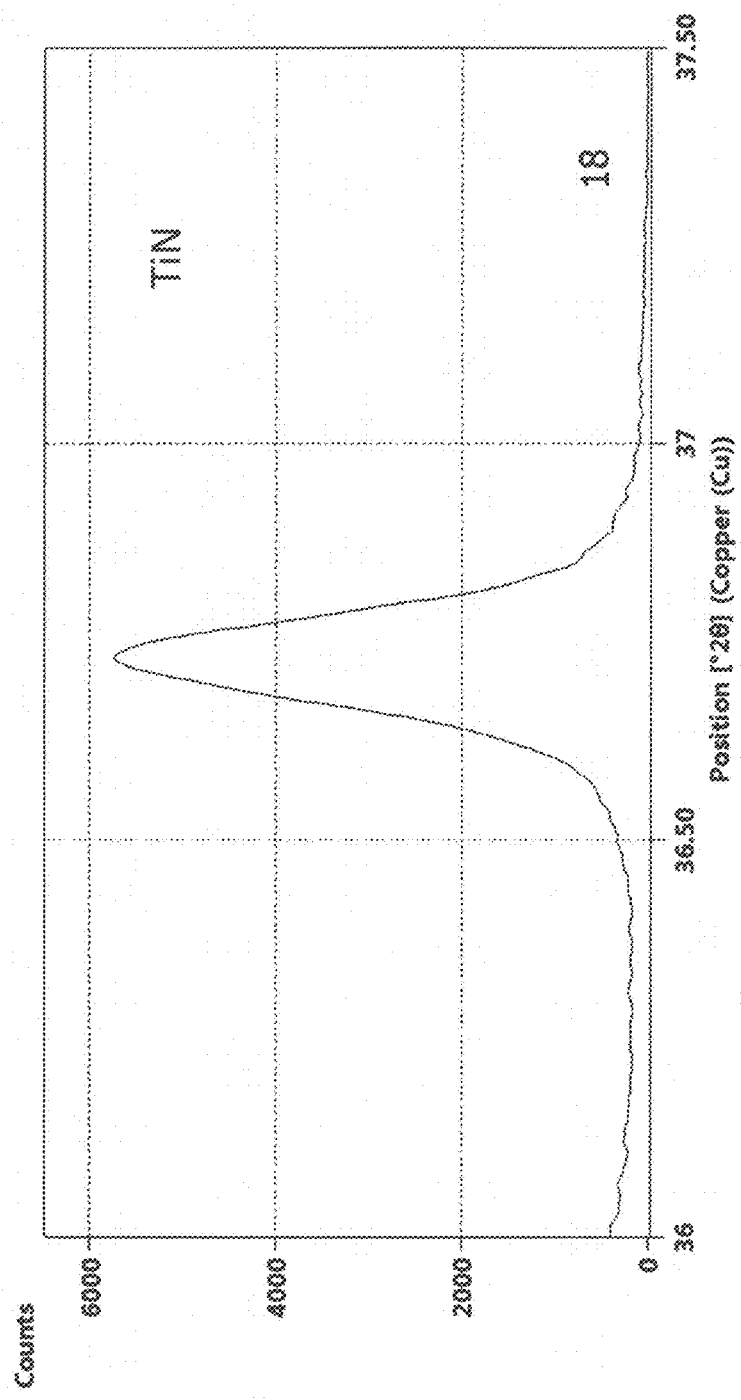
FIG. 15 shows an enlarged part of the X-ray diffractogram for Sample 18 around the (111) peak.
Figure 16:
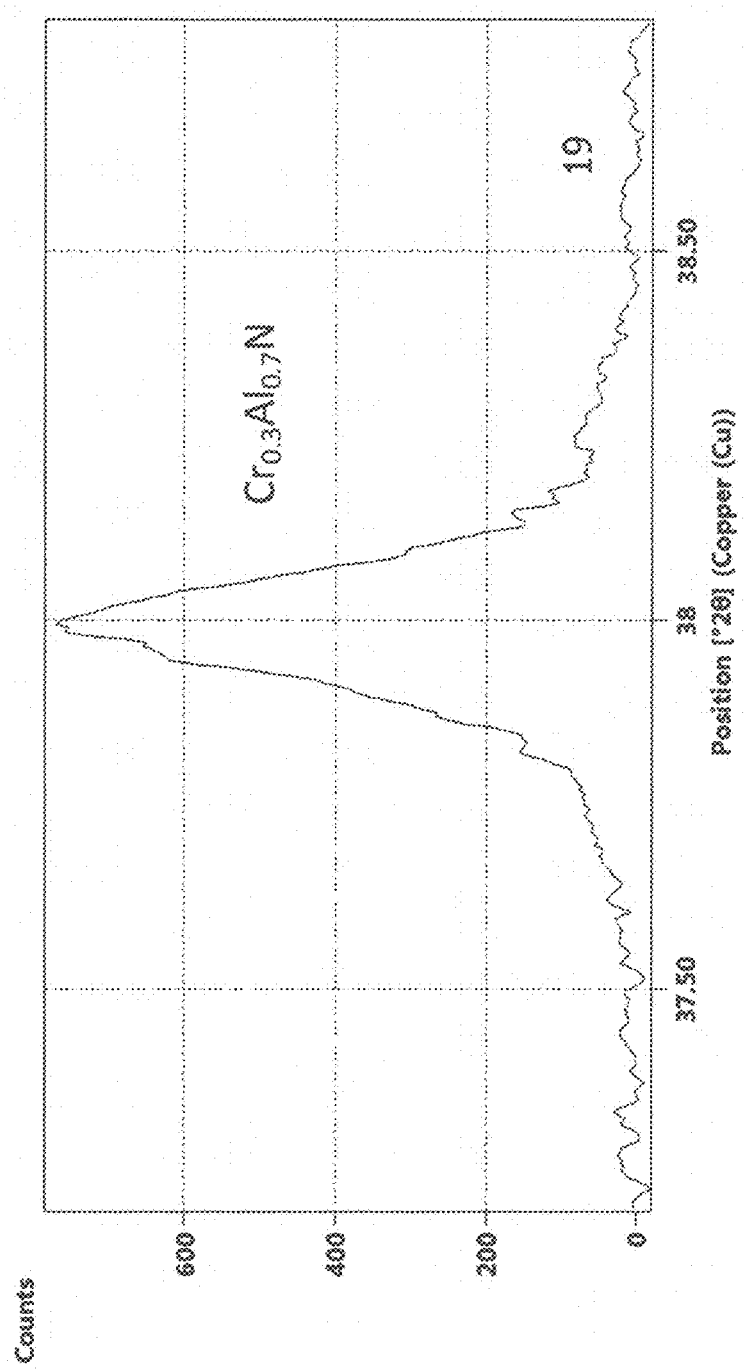
FIG. 16 shows an enlarged part of the X-ray diffractogram for Sample 19 around the (111) peak.
Figure 17:
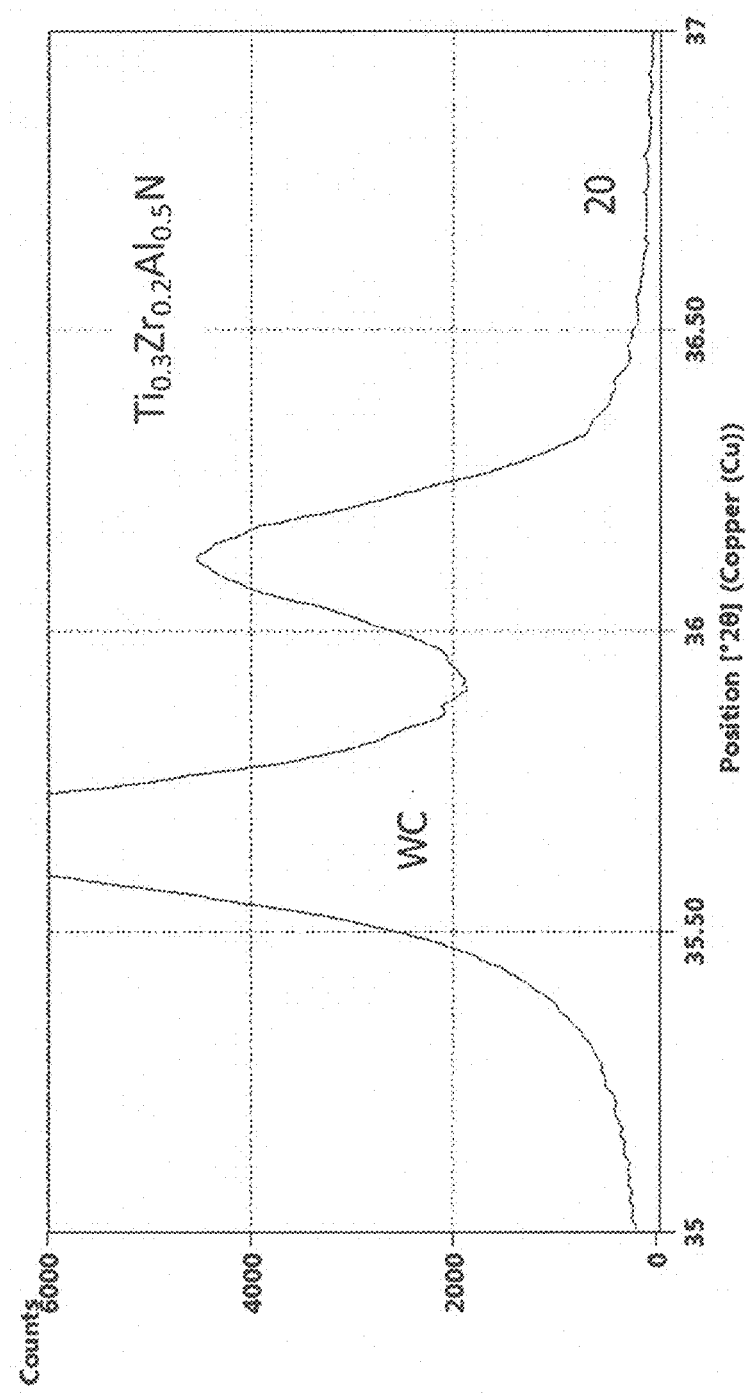
FIG. 17 shows an enlarged part of the X-ray diffractogram for Sample 20 around the (111) peak.
Figure 18:
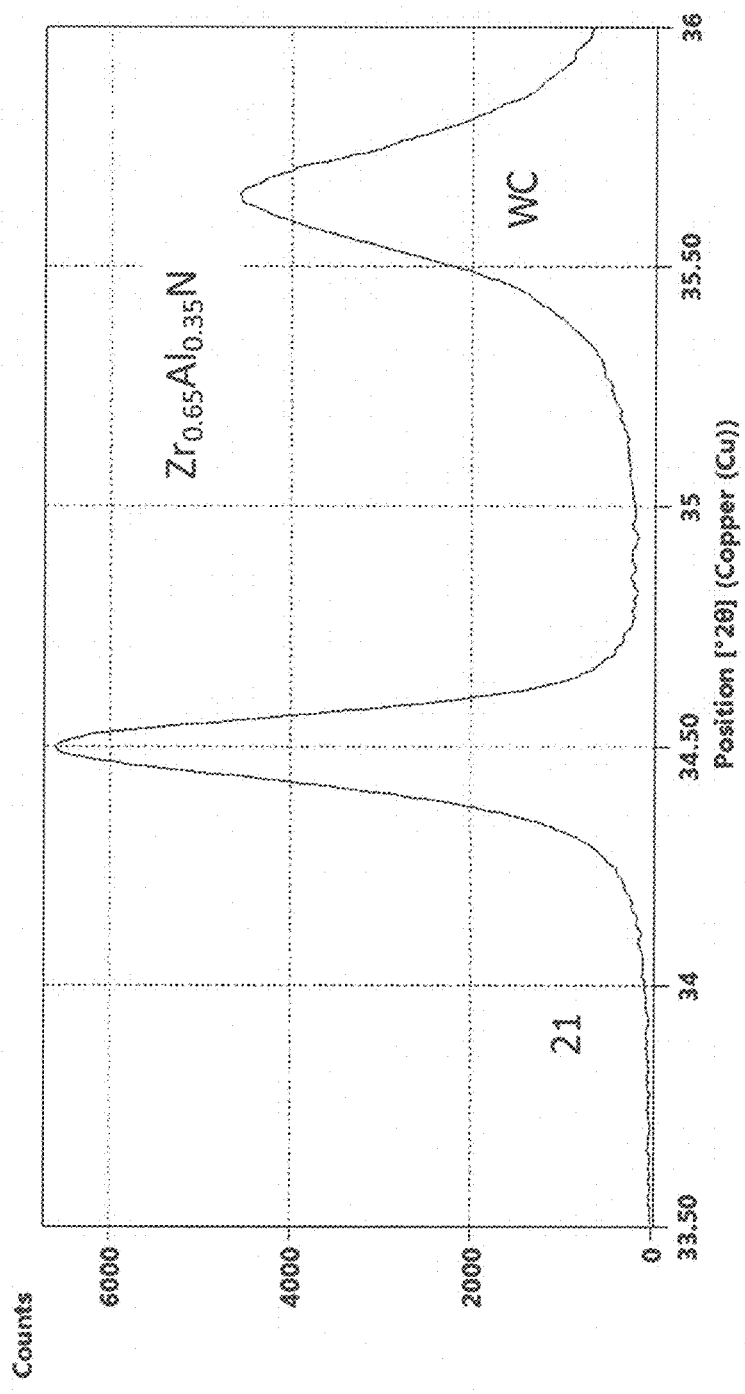
FIG. 18 shows an enlarged part of the X-ray diffractogram for Sample 21 around the (111) peak.
Figure 19:
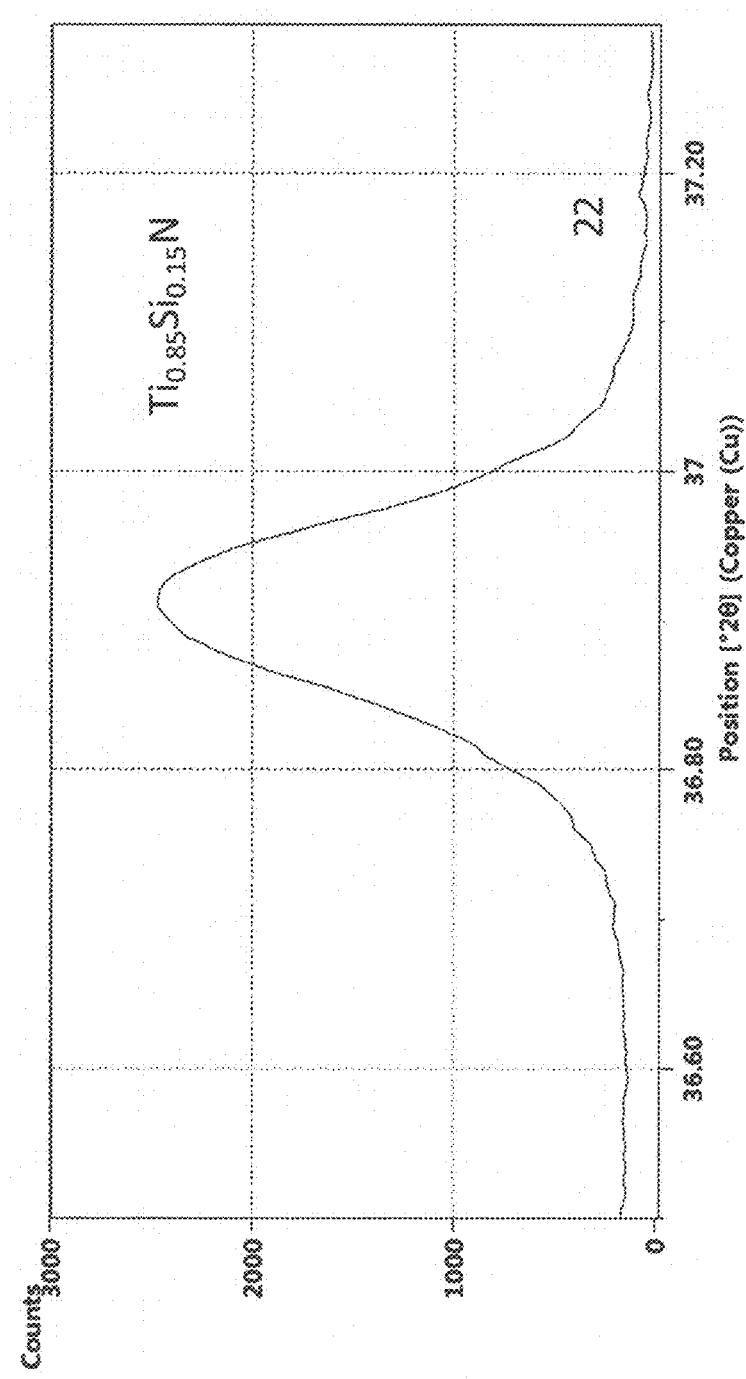
FIG. 19 shows an enlarged part of the X-ray diffractogram for Sample 22 around the (111) peak.
Figure 20:
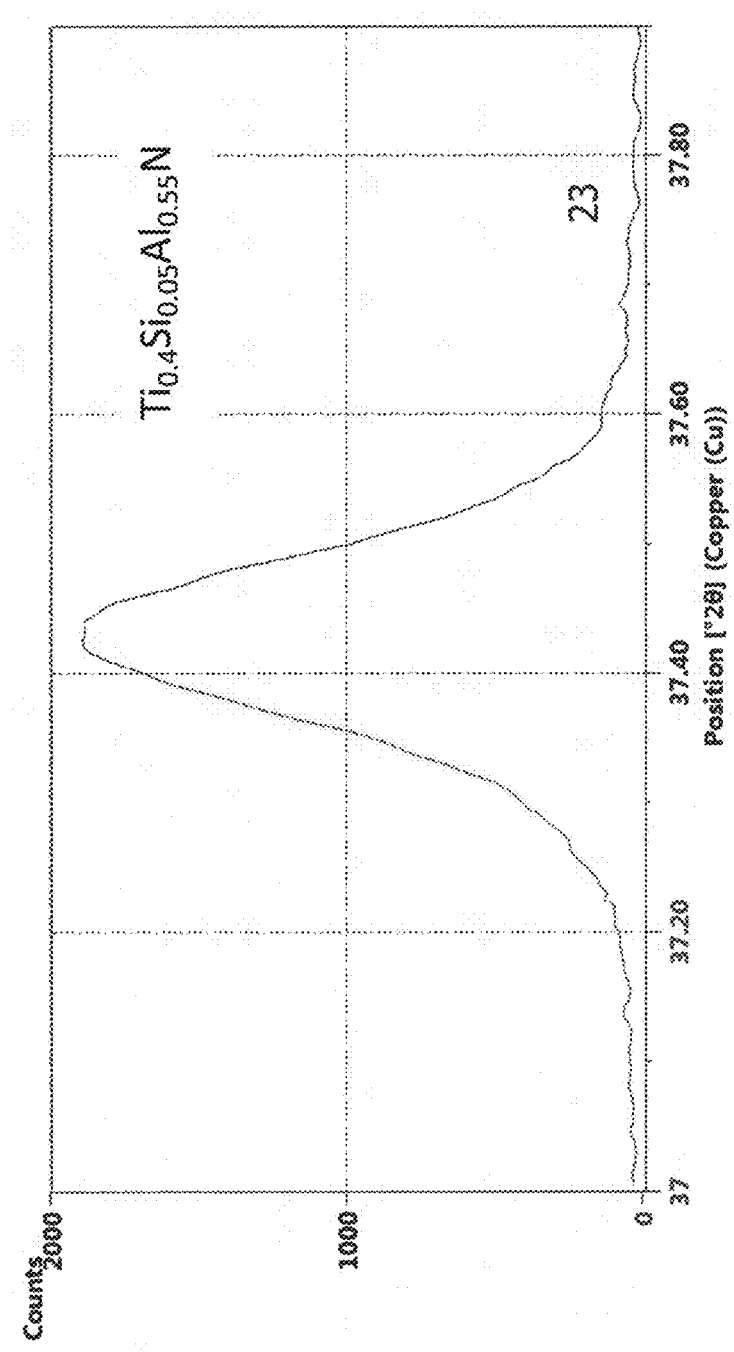
FIG. 20 shows an enlarged part of the X-ray diffractogram for Sample 23 around the (111) peak.

FIG. 13 shows combined X-ray diffractograms (not Cu-$K_{\alpha 2}$ stripped) for the coatings of Samples 18-20 all showing a sharp (111) peak. FIG. 14 shows combined X-ray diffractograms (not Cu-$K_{\alpha 2}$ stripped) for the coatings of Samples 21-23 all showing a sharp (111) peak. FIG. 15-20 show enlarged parts of the diffractograms around the (111) peak (Cu-$K_{\alpha 2}$ stripped). The FWHM and FWQM values were calculated and residual stress measurements were made. See Table 4 summarising the results.

TABLE 4

Results from SEM analysis, XRD analysis and residual stress analysis

| Sample No. | PVD layer* | Faceted crystal grains on the surface | I(111)/I(200), peak height intensities | FWHM I(111), [°2θ] | FWQM I(111), [°2θ] | Residual stress (GPa)** |
|---|---|---|---|---|---|---|
| 18. (invention) | TiN | yes, all over | 15.1 | 0.14 | 0.22 | |
| 19. (invention) | $Cr_{0.30}Al_{0.70}N$ | yes, all over | 1.2 | 0.19 | 0.39 | |
| 20. (invention) | $Ti_{0.30}Zr_{0.20}Al_{0.50}N$ | yes, all over | 9.0 | 0.23 | 0.43 | |
| 21. (invention) | $Zr_{0.65}Al_{0.35}N$ | no | 5.5 | 0.17 | 0.32 | |
| 22. (invention) | $Ti_{0.85}Si_{0.15}N$ | yes, all over | 5.5 | 0.16 | 0.35 | |
| 23. (invention) | $Ti_{0.4}Si_{0.05}Al_{0.55}N$ | yes, all over | 5.7 | 0.16 | 0.34 | −0.5 |

*based on target composition
**only for Sample No. 23

4. The coated cutting tool according to claim 1, wherein the PVD layer has a residual stress being >−3 GPa.

5. The coated cutting tool according to claim 1, wherein the PVD layer includes faceted crystal grains on its surface.

6. The coated cutting tool according to claim 1, wherein the thickness of the PVD layer is from about 0.5 to about 20 μm.

7. The coated cutting tool according to claim 1, wherein the PVD layer is a compound of the formula:

$Ti_pZr_qCr_rSi_sAl_tC_aN_bO_c$, $0 \leq p \leq 1$, $0 \leq q \leq 1$, $0 \leq r \leq 1$, $0 \leq s \leq 0.4$, $0 \leq t \leq 0.1$, $p+q+r+s+t=1$, $0 \leq a \leq 1$, $0 \leq b \leq 1$, $0 \leq c \leq 0.2$, $a+b+c=1$ or, $Ti_pZr_qCr_rSi_sAl_tC_aN_bO_c$, $0 \leq p \leq 1$, $0 \leq q \leq 1$, $0 \leq r \leq 1$, $0 \leq s \leq 0.1$, $0 \leq t \leq 0.75$, $p+q+r+s+t=1$, $0 \leq a \leq 1$, $0 \leq b \leq 1$, $0 \leq c \leq 0.2$, $a+b+c=1$.

8. The coated cutting tool according to claim 7, wherein in the formula for the PVD layer $0.9 \leq p \leq 1$, $0 \leq q \leq 0.1$, $0 \leq r \leq 0.1$, $0 \leq s \leq 0.1$, $0 \leq t \leq 0.1$.

9. The coated cutting tool according to claim 7, wherein in the formula for the PVD layer $0.25 \leq p \leq 0.9$, $0 \leq q \leq 0.1$, $0 \leq r \leq 0.1$, $0 \leq s \leq 0.1$, $0.1 \leq t \leq 0.75$.

10. The coated cutting tool according to claim 7, wherein in the formula for the PVD layer $0 \leq p \leq 0.1$, $0 \leq q \leq 0.1$, $0.2 \leq r \leq 1$, $0 \leq s \leq 0.1$, $0.1 \leq t \leq 0.8$.

11. The coated cutting tool according to claim 7, wherein in the formula for the PVD layer $0.1 \leq p \leq 0.5$, $0.1 \leq q \leq 0.5$, $0 \leq r \leq 0.1$, $0 \leq s \leq 0.1$, $0.25 \leq t \leq 0.6$.

12. The coated cutting tool according to claim 7, wherein in the formula for the PVD layer) $0 \leq p \leq 0.1$, $0.4 \leq q \leq 1$, $0 \leq r \leq 0.1$, $0 \leq s \leq 0.1$, $0 \leq t \leq 0.5$.

13. The coated cutting tool according to claim 7, wherein in the formula for the PVD layer $0.2 \leq p \leq 0.6$, $0 \leq q \leq 0.1$, $0 \leq r \leq 0.1$, $0 \leq s \leq 0.1$, $0.35 \leq t \leq 0.75$.

14. The coated cutting tool according to claim 7, wherein in the formula for the PVD layer $0.7 \leq p \leq 0.95$, $0 \leq q \leq 0.1$, $0 \leq r \leq 0.1$, $0.01 \leq s \leq 0.3$, $0 \leq t \leq 0.1$.

15. The coated cutting tool according to claim 1, wherein in the formula for the PVD layer $0 \leq a \leq 0.25$, $0.75 \leq b \leq 1$, $0 \leq c \leq 0.05$, $a+b+c=1$.

* * * * *